(12) United States Patent
Crippa et al.

(10) Patent No.: US 8,971,112 B2
(45) Date of Patent: *Mar. 3, 2015

(54) METHOD OF PROGRAMMING A MULTI-LEVEL MEMORY DEVICE

(71) Applicant: Micron Technology, Inc., Boise, ID (US)

(72) Inventors: Luca Crippa, Busnago (IT); Rino Micheloni, Turate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/046,297

(22) Filed: Oct. 4, 2013

(65) Prior Publication Data

US 2014/0036588 A1    Feb. 6, 2014

Related U.S. Application Data

(62) Division of application No. 12/551,383, filed on Aug. 31, 2009, now Pat. No. 8,553,462, which is a division of application No. 11/460,835, filed on Jul. 28, 2006, now abandoned.

(30) Foreign Application Priority Data

Jul. 28, 2005 (EP) .................................... 05106972
Jun. 7, 2006 (EP) .................................... 06115106

(51) Int. Cl.
*G11C 16/10* (2006.01)
*G11C 16/34* (2006.01)
*G11C 16/26* (2006.01)
*G11C 16/12* (2006.01)

(Continued)

(52) U.S. Cl.
CPC ............ *G11C 16/10* (2013.01); *G11C 11/5628* (2013.01)
USPC ............ 365/185.08; 365/185.05; 365/185.03; 365/185.17; 365/185.18; 365/185.19; 365/185.22; 365/185.24

(58) Field of Classification Search
CPC ........ G11C 16/00; G11C 16/02; G11C 16/04; G11C 16/0483; G11C 16/06; G11C 16/10; G11C 16/12; G11C 16/26; G11C 16/34; G11C 16/3418; G11C 16/3422; G11C 16/3427; G11C 16/3431; G11C 16/3436; G11C 16/3454; G11C 16/3459; G11C 2216/14; G11C 2216/16
USPC ............. 365/185.03, 185.05, 185.08, 185.17, 365/185.18, 185.19, 185.22, 185.24
See application file for complete search history.

(56) References Cited

U.S. PATENT DOCUMENTS 5,894,436 A    4/1999 Ohkawa et al.
6,091,637 A    7/2000 Hakozaki (Continued)

FOREIGN PATENT DOCUMENTS

EP    1 249 842    10/2002

*Primary Examiner* — J. H. Hur
(74) *Attorney, Agent, or Firm* — Dicke, Billig & Czaja, PLLC

(57) ABSTRACT

Method of programming a multi-level memory cell may include transferring one or more values between an auxiliary latch of the multi-level memory cell and a most significant bit (MSB) latch of the multi-level memory cell and/or between the auxiliary latch and a least significant bit (LSB) latch of the multi-level memory cell while programming the multi-level memory cell.

20 Claims, 47 Drawing Sheets

(51) Int. Cl.
   *G11C 16/06* (2006.01)
   *G11C 11/56* (2006.01)

(56) References Cited

U.S. PATENT DOCUMENTS

| | | |
|---|---|---|
| RE37,611 E | 3/2002 | Roohparvar |
| 7,042,770 B2 | 5/2006 | Lee et al. |
| 8,553,462 B2 * | 10/2013 | Crippa et al. ............ 365/185.24 |
| 2002/0036930 A1 * | 3/2002 | Shibata et al. ................ 365/195 |
| 2002/0126531 A1 | 9/2002 | Hosono et al. |
| 2004/0027901 A1 | 2/2004 | Shiga et al. |
| 2004/0109352 A1 | 6/2004 | Lee et al. |
| 2004/0125651 A1 * | 7/2004 | Toda ........................ 365/185.03 |
| 2004/0170062 A1 | 9/2004 | Micheloni et al. |
| 2005/0018488 A1 | 1/2005 | Kim et al. |
| 2006/0083071 A1 * | 4/2006 | Nagashima .............. 365/185.28 |
| 2006/0221704 A1 * | 10/2006 | Li et al. .................... 365/185.28 |

* cited by examiner

* WE HAVE 0 IF CELL THRESHOLD VOLTAGE IS UNDER VVFY1-Δ

* VVFY3 A LITTLE BIT HIGHER THAN USUAL

* WE HAVE 0 IF CELL THRESHOLD VOLTAGE IS UNDER VVFY1-Δ

*PROGRAM/VERIFY ONLY CELLS WITH THRESHOLD VOLTAGE UNDER VVFY1-Δ

* VVFY2/VVFY3 A LITTLE BIT HIGHER THAN USUAL

* VVFY2/VVFY3 A LITTLE BIT HIGHER THAN USUAL

METHOD OF PROGRAMMING A MULTI-LEVEL MEMORY DEVICE

RELATED APPLICATIONS

This application is a Divisional of U.S. application Ser. No. 12/551,383 titled "METHOD OF PROGRAMMING A MULTI-LEVEL MEMORY DEVICE" filed Aug. 31, 2009 and issued as U.S. Pat. No. 8,553,462 on Oct. 8, 2013, which is a Divisional of U.S. application Ser. No. 11/460,835 titled "Method of Programming a Four-Level Flash Memory Device and Related Page Buffer" filed Jul. 28, 2006 (Abandoned), which claims priority to European Patent Application No. 06115106.4 filed Jun. 7, 2006 and European Patent Application No. 05106972.2 filed Jul. 28, 2005. The specifications of said applications are hereby incorporated by reference, in their entirety, except for those sections, if any, that are inconsistent with the present specification.

FIELD

The present disclosure relates in general to memory devices, and in particular, to a method of programming a multi-level memory device.

BACKGROUND

A logic state is stored in a cell by programming its threshold voltage. In non-volatile memory devices this is done by transferring a certain electrical charge in a floating gate of the cell.

The storage capacity of memory devices can be multiplied by storing more than one bit of information in each single cell of the same physical structure as if intended to store a single information bit. This is in addition to increasing the integration density of arrays of cells individually addressable through wordlines and bit-lines of the array.

Though based on the same physical mechanisms, the programming and reading of cells that store more than one bit (multi-level cells) are carried out with techniques that differ from those used for cells that store a single bit (two-level cells).

To read a two-level memory array cell, a certain voltage is applied to the control gate (wordline) of the cell. The value of such a reading voltage is between the threshold voltage of an erased cell and the threshold voltage of a programmed cell such that when the cell is programmed, the reading voltage is lower than its threshold voltage. As a consequence, no current flows through the cell. In contrast, when the cell is erased, the reading voltage is higher than its threshold voltage, and thus a current flows through the cell.

In four-level cells, two bits of information may be stored by making the programming voltages of the different thresholds that may be set for one memory cell define four different intervals. Each interval is associated to a respective two-bit datum. A reading operation is carried out by comparing an electrical parameter, correlated with the current that flows through the cell, with four distinct reference intervals. The reference intervals are defined by the three different thresholds that may be programmed for each single cell. Each one is associated to a respective two-bit datum. The logic datum associated to the distinct interval of values (threshold voltage distributions) in which the measured electrical parameter falls is thus determined This approach for a multi-level operation of the cells is applicable to volatile memory cells, such as DRAMs, as well as to non-volatile memory devices, such as EEPROMs and FLASH-EPROMs.

Of course, incrementing the number of information bits that may be stored in a single memory cell makes certain functioning characteristics of the memory array cells more critical, such as their immunity to disturbances (noise), to the spread of information retention characteristics, and to ensure appropriate tolerance ranges of the biasing voltages at which each cell is programmed and read.

A basic circuit scheme of two memory array bitlines and a so-called page buffer of a four-level FLASH memory is depicted in FIG. 1 and it is described in great detail in European Patent Application No. 05106972.2 This application is assigned to the current assignee of the present invention, the contents of which are incorporated herein by reference in its entirety. The page buffer manages the operations of reading the information stored in the memory cells of a selected memory page, or of writing new information in the cells.

The page buffer includes a buffer register of the same size (capacity) of that of a memory page, in which data read (in parallel mode) from the memory cells of a selected memory page are temporarily stored, before being serially output. Similarly, when data are to be written in a memory page, the page buffer is replenished with data that are thereafter written in parallel in the memory cells of a selected memory page. Therefore, a page buffer normally includes a relatively large number of volatile storage elements, typically bistable elements or latches, in a number corresponding to the number of memory cells of the memory page.

The basic operations that usually are performed on the memory cells are a page read (an operation involving reading data from a selected memory page), a page program (writing data into a selected memory page), and an erase operation, wherein the content of the memory cells is erased.

In four-level memory devices, a two-bits datum may be stored in each cell by programming the latter in any one of four different states. Each one is associated with a corresponding logic value of the two-bits datum. Usually, the programming state of a memory cell is defined by the threshold voltage value of the transistor structure that is included in the memory cell structure.

In a memory cell adapted to store two bits, the threshold voltage values of the memory cells may assume one of four different values (or ranges of values). A typical choice is to associate the logic values of the stored bit pair to the four different states according to a binary sequence 11, 10, 01, 00 as shown in FIG. 2, corresponding to increasing threshold voltage values, with the logic value 11 being associated to the state of lowest threshold voltage value (erased state), and the others associated in succession to states of increased threshold voltage value.

Naturally, for writing data into a two-bit memory cell or for reading data therefrom, it might be necessary to perform up to three read accesses to the memory cells using different read voltage references.

A known approach for reducing the number of read accesses necessary to retrieve the stored data includes using a different association rule between logic values and states, that make use of the Gray code, as depicted in FIG. 2. In this way, the logic values are associated to the threshold states according to the binary sequence 11, 10, 00, 01 with the logic value 11 being associated to the erased state, and the others associated in succession to states of increased threshold voltage values.

The main feature of using the Gray code is the fact that adjacent programmed states (in terms of threshold voltage values) have corresponding logic values that differ from each other by only one bit.

In the ensuing description reference will be made to embodiments that employ such a coding, but the same considerations that will be made apply to any kind of coding for storing a two-bit datum in a cell of a four-level memory device.

In order to discriminate the value stored in the cell, the read voltages Vread0, Vread1 and Vread2 hould be sufficiently distant from the upper and lower bounds of the distributions of the threshold voltages of the cells, as depicted in FIG. 3.

The cells of a memory page are programmed in parallel by incrementing stepwise their threshold voltage. They do not reach at the same time the desired distributions because there are cells that are faster than the others and require fewer program pulses to reach the programmed threshold. After each program pulse, the cells are read for verifying whether they have been correctly programmed or not. When a cell is found to have a threshold voltage comprised in the desired distribution, it is considered programmed and a configuration switch associated to it is opened so that the programmed cell will not receive any further program pulse.

After having programmed and verified the cells, it is often found that some cells inexplicably no longer have a threshold voltage comprised in the distribution to which they were programmed, and therefore the datum stored therein is not the correct one. More precisely, it appears that the threshold voltage of the fastest cells, that is, the cells that reached first the desired distribution have decreased while the remaining cells were given additional program pulses.

For better understanding the problem, let us refer to the circuit of FIG. 4 and consider a sample case in which all the cells of the wordline WL<31> should be programmed to the logic state 10 All the cells are initially in the erased state, that is, in the state 11 The cell MC 31 is subjected to program pulses until its threshold voltage surpasses the voltage VVFY1.

This is carried out by applying the voltage VVFY1 on the wordline WL<31> and stopping to apply further program pulses to the cell MC 31 when there is not anymore current flowing through the cell. In this situation, the cell MC 31 is considered to have been programmed to the binary logic state 10.

Unfortunately, it may happen that the read margins, that is the difference between the lower bound voltage of the distribution corresponding to the state 10 and a pre-established read voltage Vread0 be smaller than the design value.

What happens is schematically illustrated in FIG. 5. The cell is initially erased (a) and must be programmed in the state 10 while ensuring a certain read margin. Program pulses are provided to the cell (b) and a threshold voltage greater than the level VVER1 is eventually verified. When other cells of the same bitline have been programmed, it seems as the threshold voltage of the cell appears to have shifted to the left (c) and the read margin may become smaller than the designed safe value (d).

SUMMARY

Extensive investigations carried out by the applicant have lead to the conclusion that the above described effect is probably due to the fact that the source line voltage $V_S$ of the circuit of FIG. 4 is not constant nor negligible. As a matter of fact, when the cells of other bitlines of the same page are being programmed, the total current $I_{SECTOR}$ flowing through these bitlines flows also through the source line transistor MTSRCTOGND and through the two resistors $R_{SL}1$ and $R_{SL}2$ Thus, the voltage on the $V_S$ node is not negligible and the cell MC 31 is incorrectly verified as having reached the desired programmed state.

When the other cells have been programmed, the current $I_{SECTOR}$ nullifies, the voltage $V_S$ becomes negligible and it is then observed that the threshold voltage of the cell MC 31 is no longer correctly comprised in the distribution corresponding to the state 10 This could explain why it appears that the threshold voltage of cells that first reach the desired program distribution becomes smaller while other cells of the same page are programmed.

In embodiments of the present invention, when the threshold voltage of a cell is verified to have reached the desired distribution, then the cell is read using a test read voltage smaller than or equal to the program voltage. In this situation the voltage $V_S$ on the source node is negligible, and the programmed state of the cell may be correctly verified.

An architecture of a page buffer particularly suitable for implementing the method of the invention is also provided

DETAILED DESCRIPTION

In a four-level memory device, each cell is associated with at least a pair of latches, e.g., a MSB LATCH and a LSB LATCH, of the page buffer for storing the bits of the two-bit datum to be written in the cell, and for inhibiting program operations on an already programmed cell. Three alternate embodiments of the method of the invention will now be described.

First Embodiment

Figure 1:
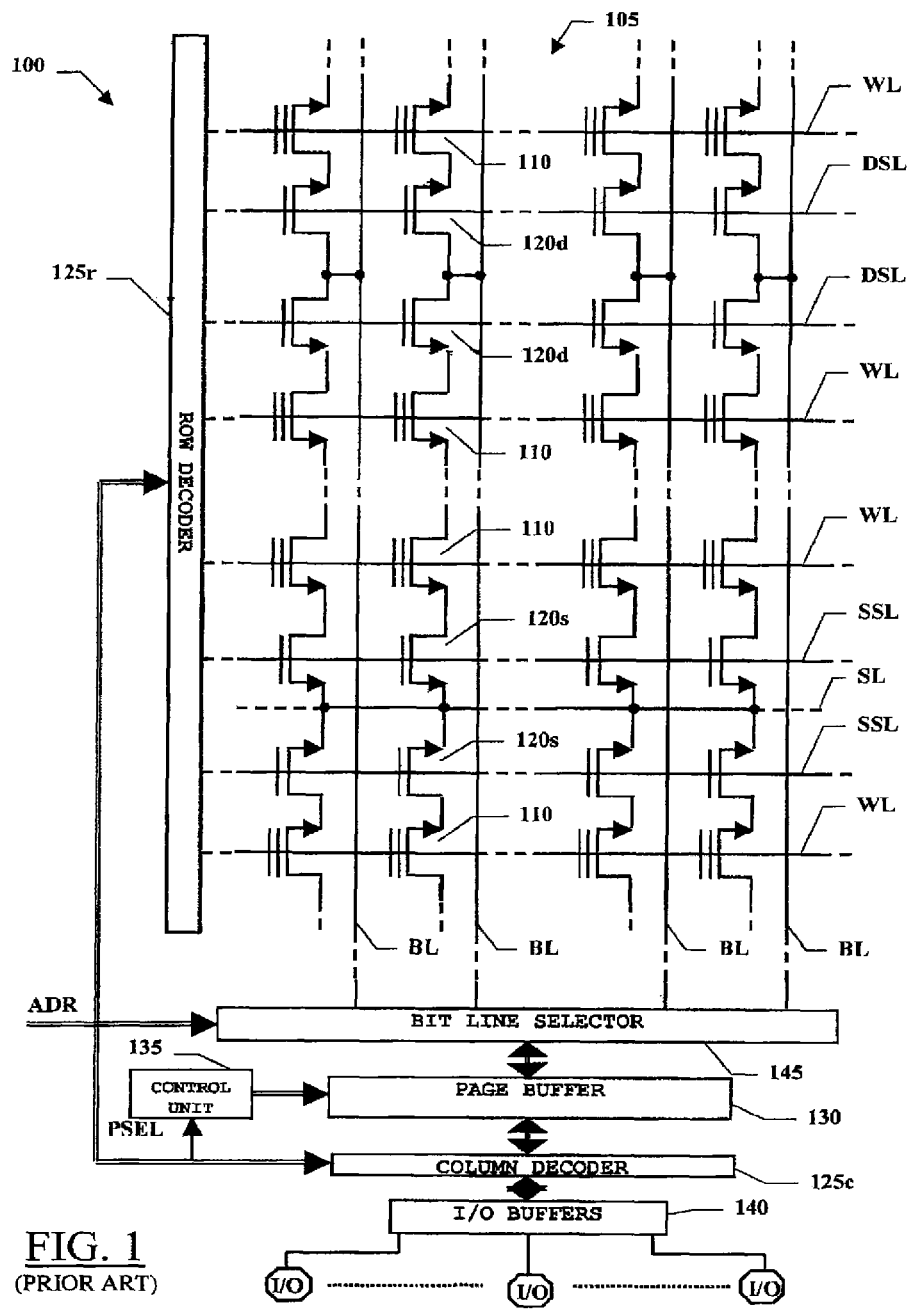
FIG. 1 depicts a page buffer of a four-level FLASH memory according to the prior art.
Figure 2:
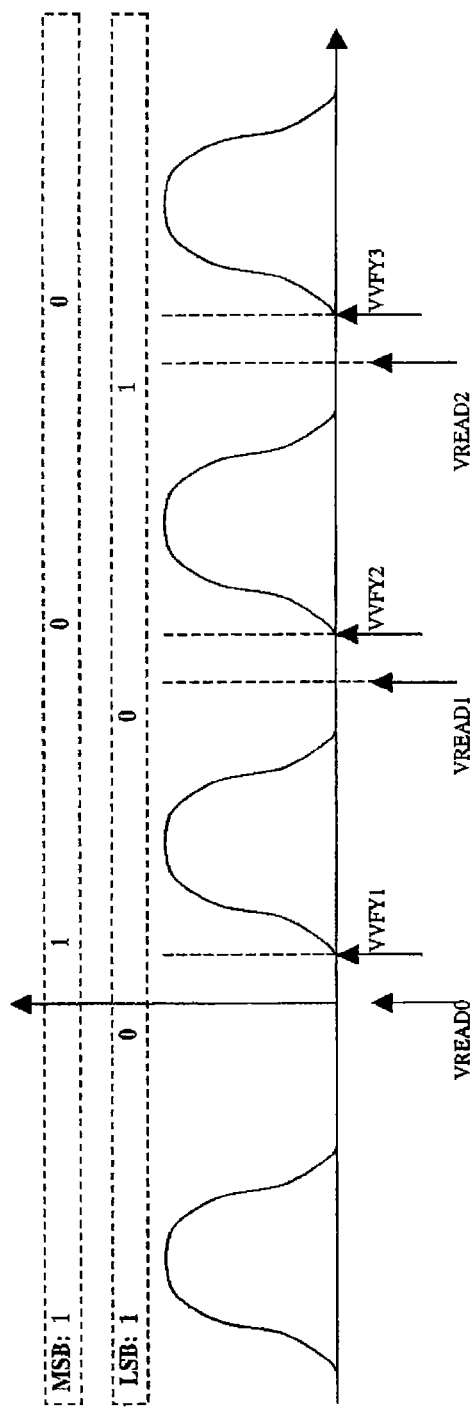
FIG. 2 illustrates the Gray code of a two-bit datum stored in a four level memory cell according to the prior art.
Figure 3:
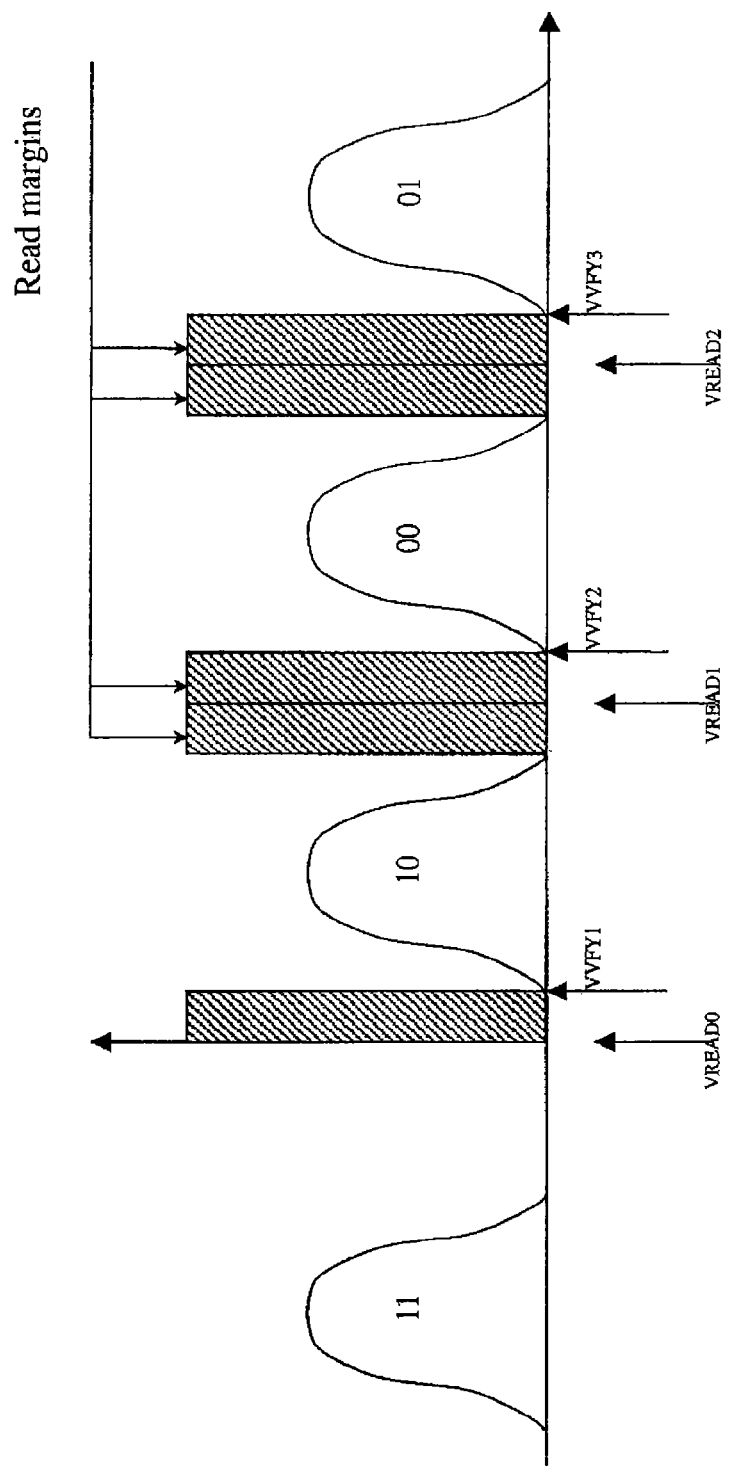
FIG. 3 shows the read margins of a memory cell storing a two-bit datum according to the Gray code according to the prior art.
Figure 4:
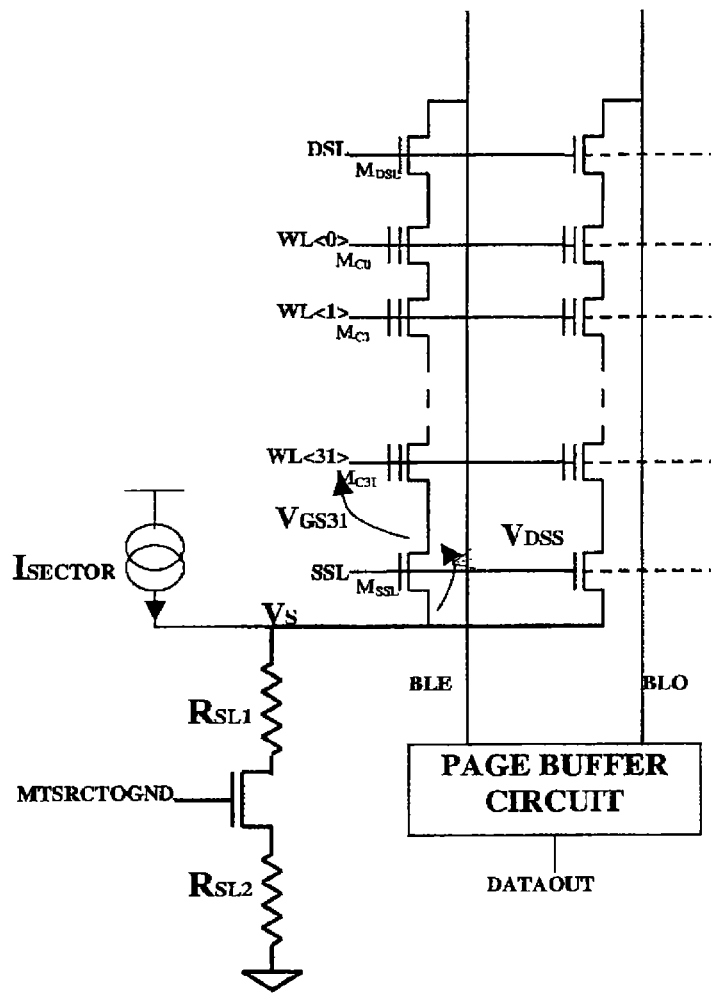
FIG. 4 is a simplified view of a page of a FLASH memory device according to the prior art.
Figure 5:
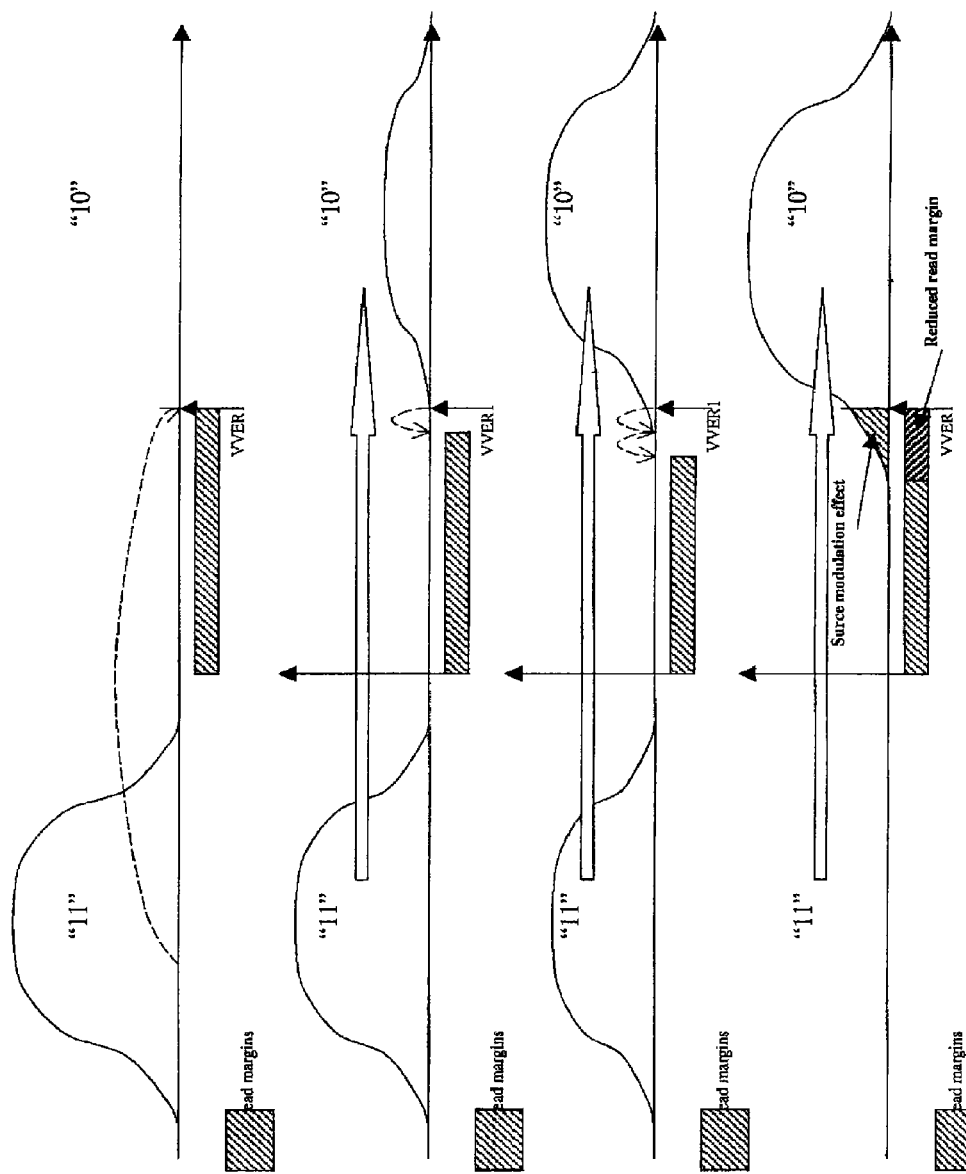
FIG. 5 illustrates the apparent shift of the programmed threshold voltage of a cell of a four level FLASH memory according to the prior art.
Figure 6:
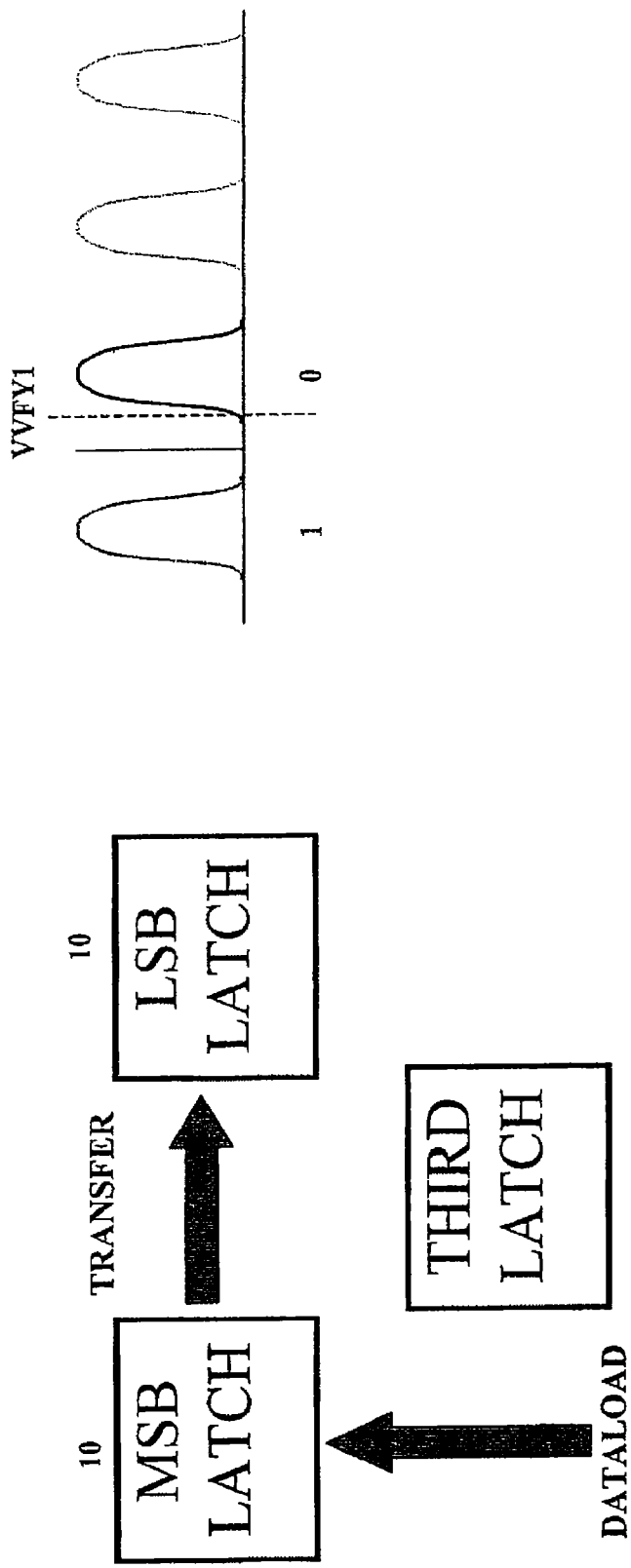
FIGS. 6 to 11 show method steps for programming and verifying the least significant bit of a two-bit datum to be stored in the memory cell according to a first embodiment of the invention.

The least significant bit of a two-bit datum to be stored in a cell is loaded into the respective latch LSB LATCH of the page buffer. According to a common practice, but not necessarily, it is first stored in the latch dedicated for the most significant bit MSB LATCH, and then it is transferred to the latch LSB LATCH as schematically illustrated in FIG. 6.

Figure 7:
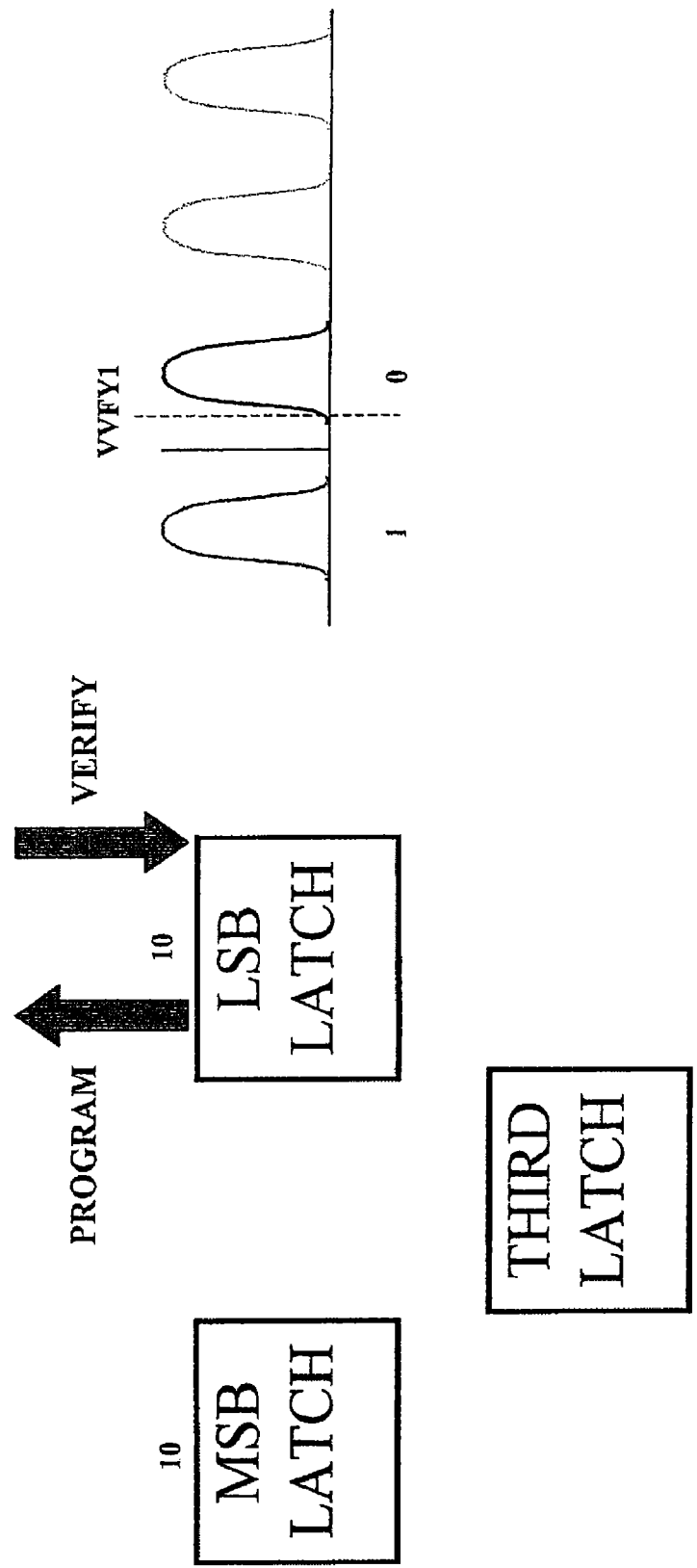

Program pulses are applied to the cell (in parallel to all other cells to be programmed) for increasing its threshold voltage up to surpass the first program voltage VVFY1 (FIG. 7). After each program pulse, it is verified whether the cell has been correctly programmed or not. In the former case, a 1 is stored in the LSB LATCH (FIG. 8) for inhibiting application of further program pulses to the cell.

According to the method, the programmed cell is read using a test read voltage for verifying if effectively the threshold of the programmed cell has reached the desired value by ascertaining that the design read voltage margin has not become reduced because of the above discussed effect on the programming verification of a significant voltage present on the source node V.sub.S.

Figure 9:
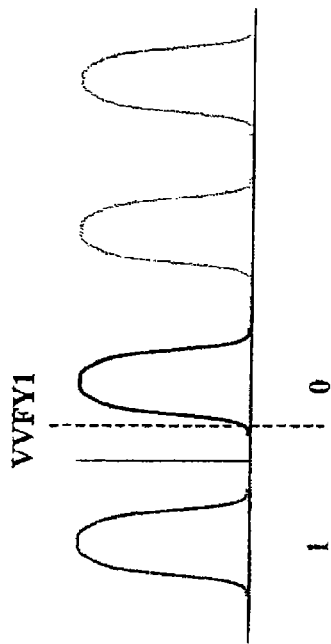
Figure 9:
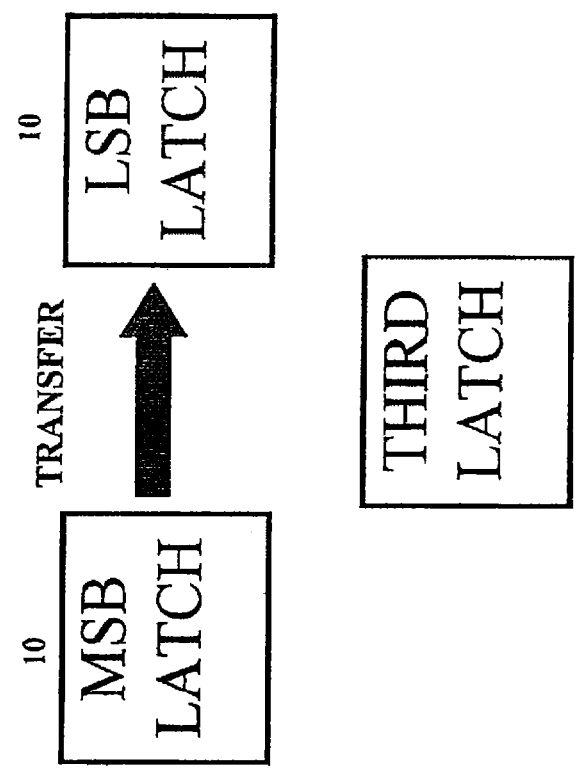
Figure 10:
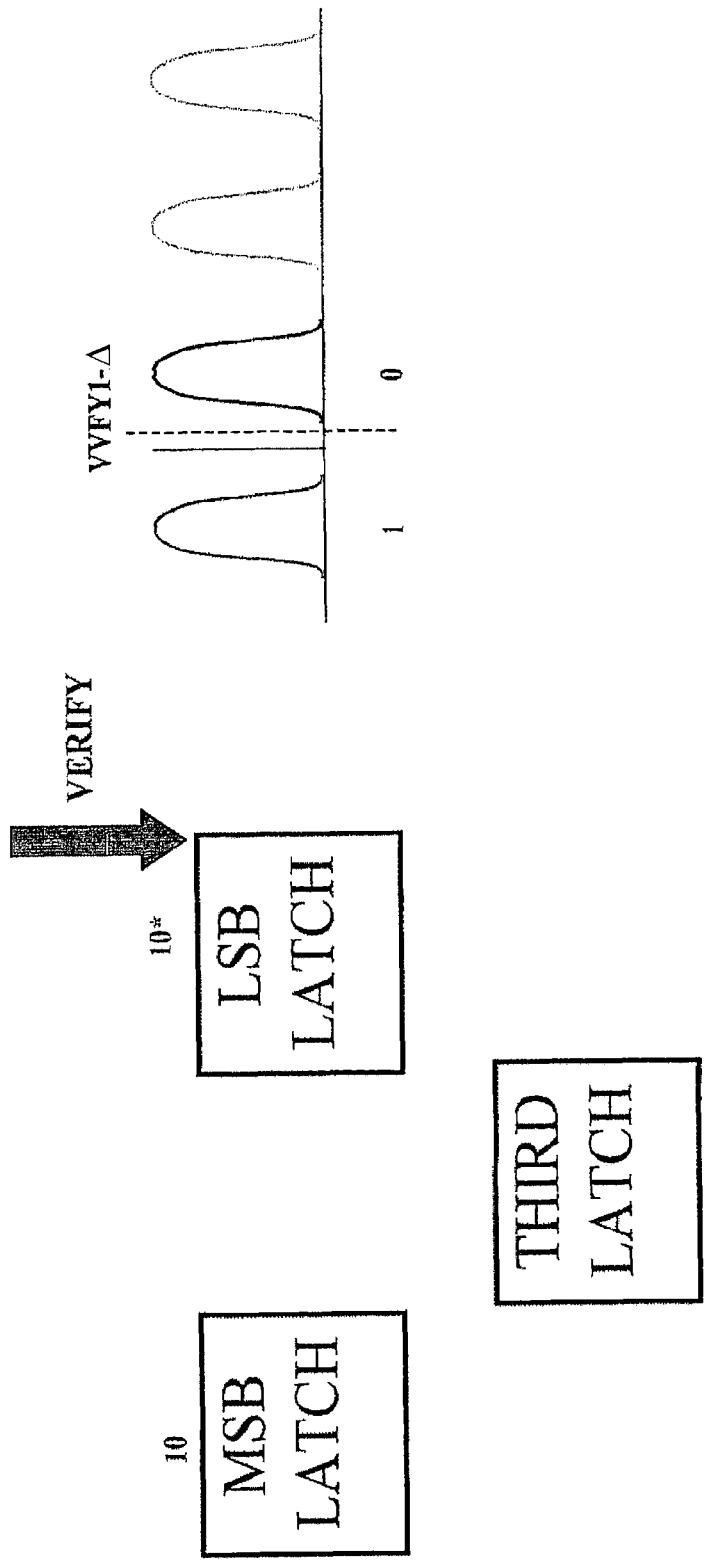

Accordingly, the least significant bit still stored in the MSB LATCH is transferred into the LSB LATCH (FIG. 9), and the cells are read using a first test read voltage VVFY1.DELTA. smaller than or equal to the program voltage VVFY1 (FIG. 10).

Figure 11:
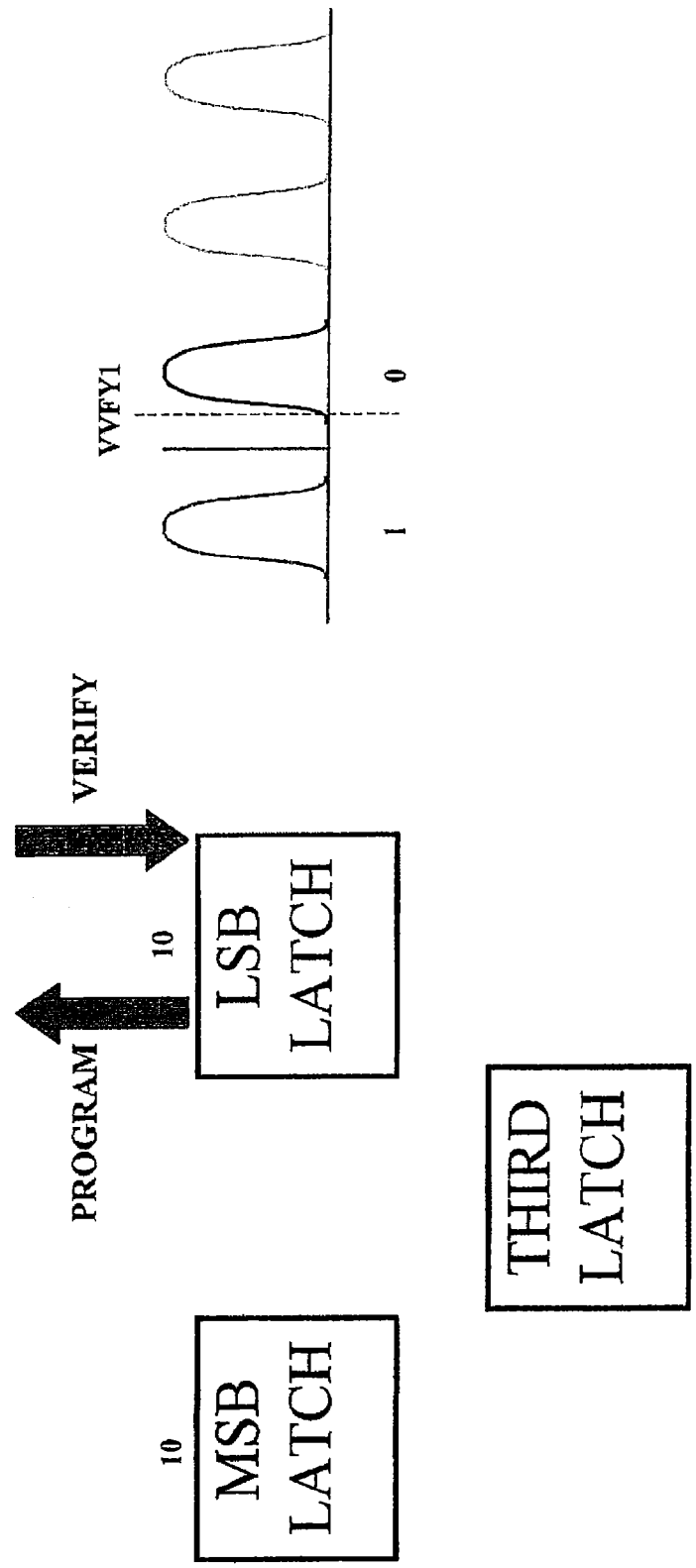

If a cell read confirm to be correctly programmed, a 1 is loaded in the respective LSB LATCH for inhibiting further program pulses from being applied to the cell (FIG. 11). A 0 in the LSB LATCH means that the corresponding cell has not yet been correctly programmed, and further program pulses need to be applied to it up to make its threshold surpass the program voltage VVFY1.

Then the most significant bit (MSB) is loaded in the MSB LATCH. The least significant bit (LSB) stored in the cell is read from the cell using the read voltage Vread0 (FIG. 12) and is transferred to an auxiliary latch THIRD LATCH (FIG. 13).

Figure 14:
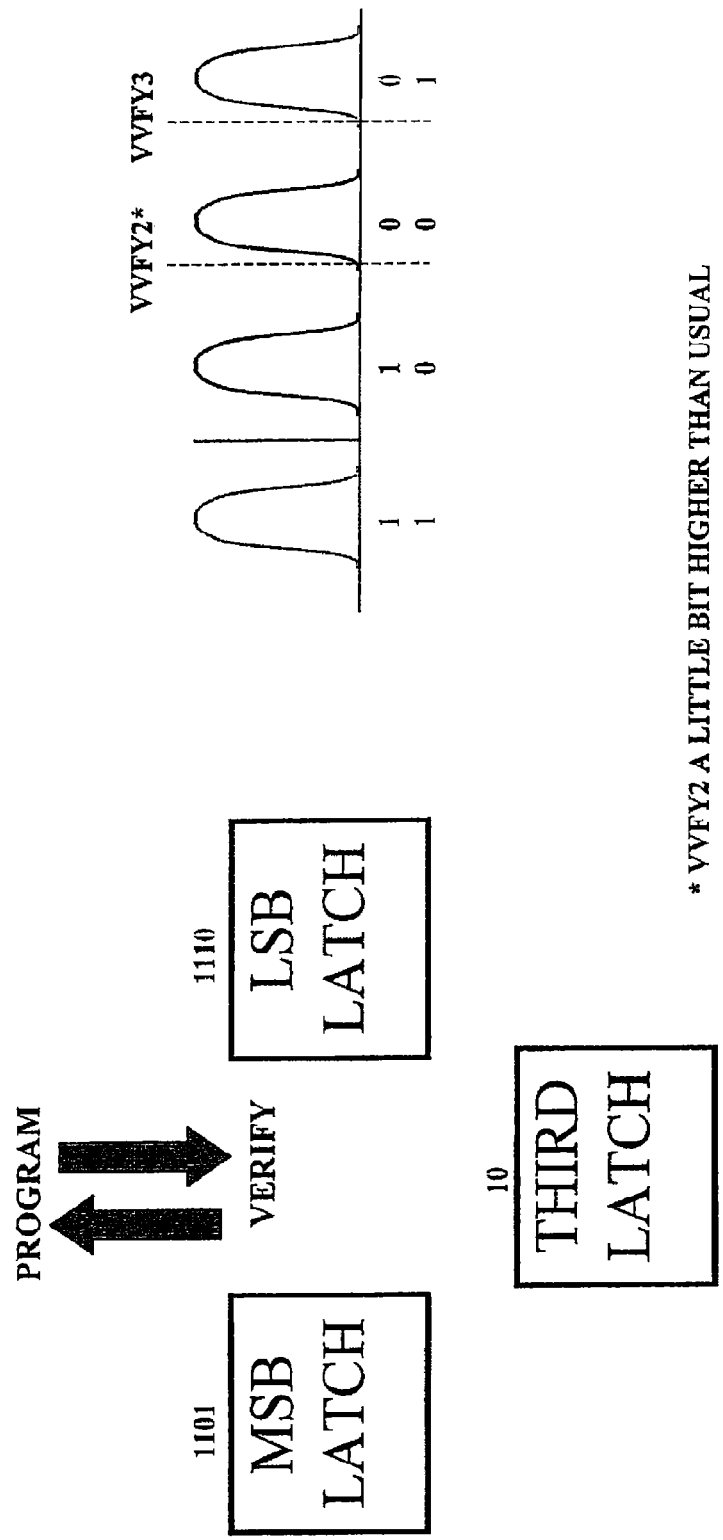
Figure 15:
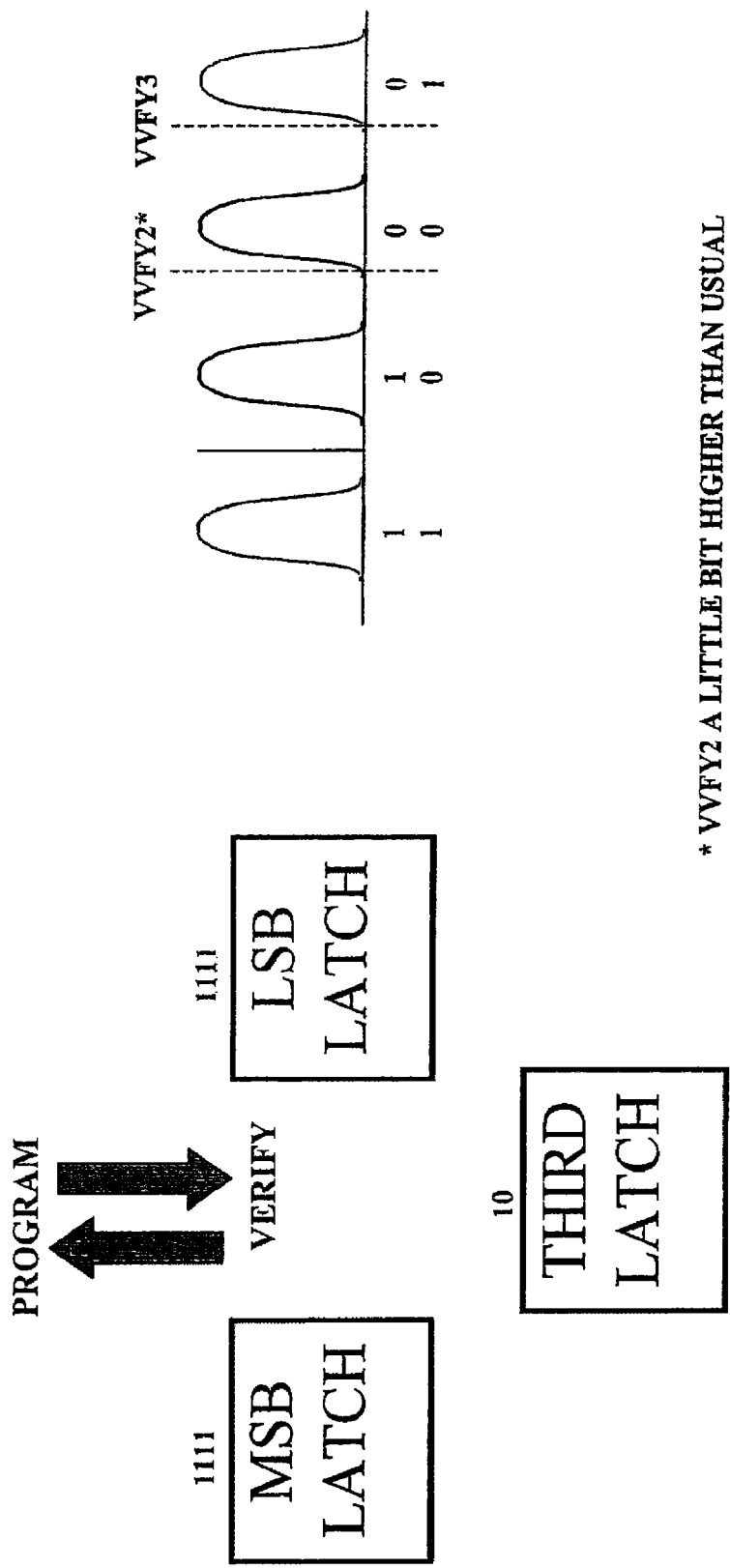

The cell is or is not programmed depending on the most significant bit and the least significant bit respectively stored in MSB LATCH and in the LSB LATCH. The program voltage VVFY2 or VVFY3 that is used depends on the bits of the two-bit datum to be stored in the cell (FIG. 14). Once the desired threshold voltage has been attained, a 1 is loaded in both latches MSB LATCH and LSB LATCH (FIG. 15).

Figure 16:
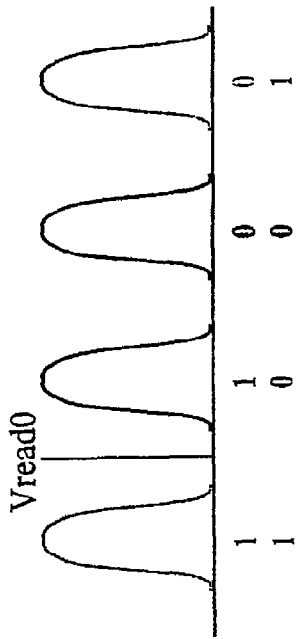
Figure 16:
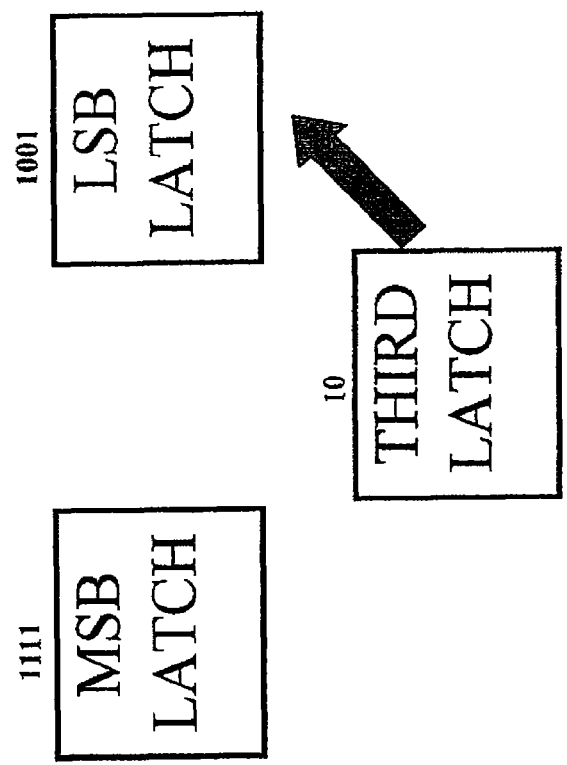

The auxiliary latch THIRD LATCH stores the least significant bit that was to be stored in the cell, and its content is copied into the latch dedicated to the least significant bit LSB LATCH (FIG. 16).

The most significant bit to be programmed in the cell is established by reading the cell with a second read voltage Vread1 (FIG. 17), and the read MSB is copied into the dedicated latch MSB LATCH. Therefore, the latches LSB LATCH and MSB LATCH now store the pair of bits that should have been stored into the memory cell.

Figure 18:
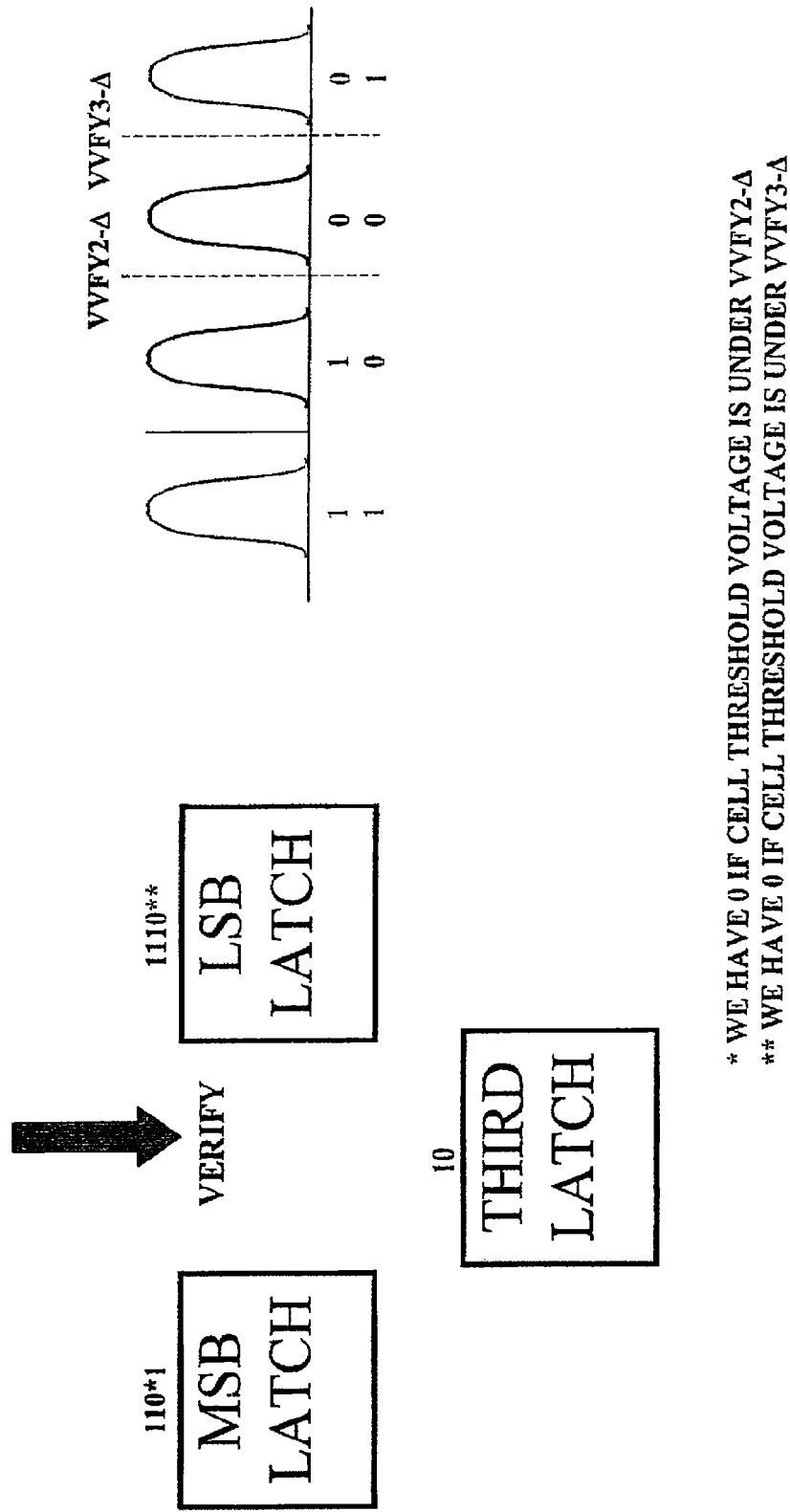

Correctness of the programming is tested by reading the cell with a second VVFY2-.DELTA. or a third test read voltage VVFY3-.DELTA. smaller than or equal to the respective program voltage VVFY2 or VVFY3 (FIG. 18).

Figure 19:
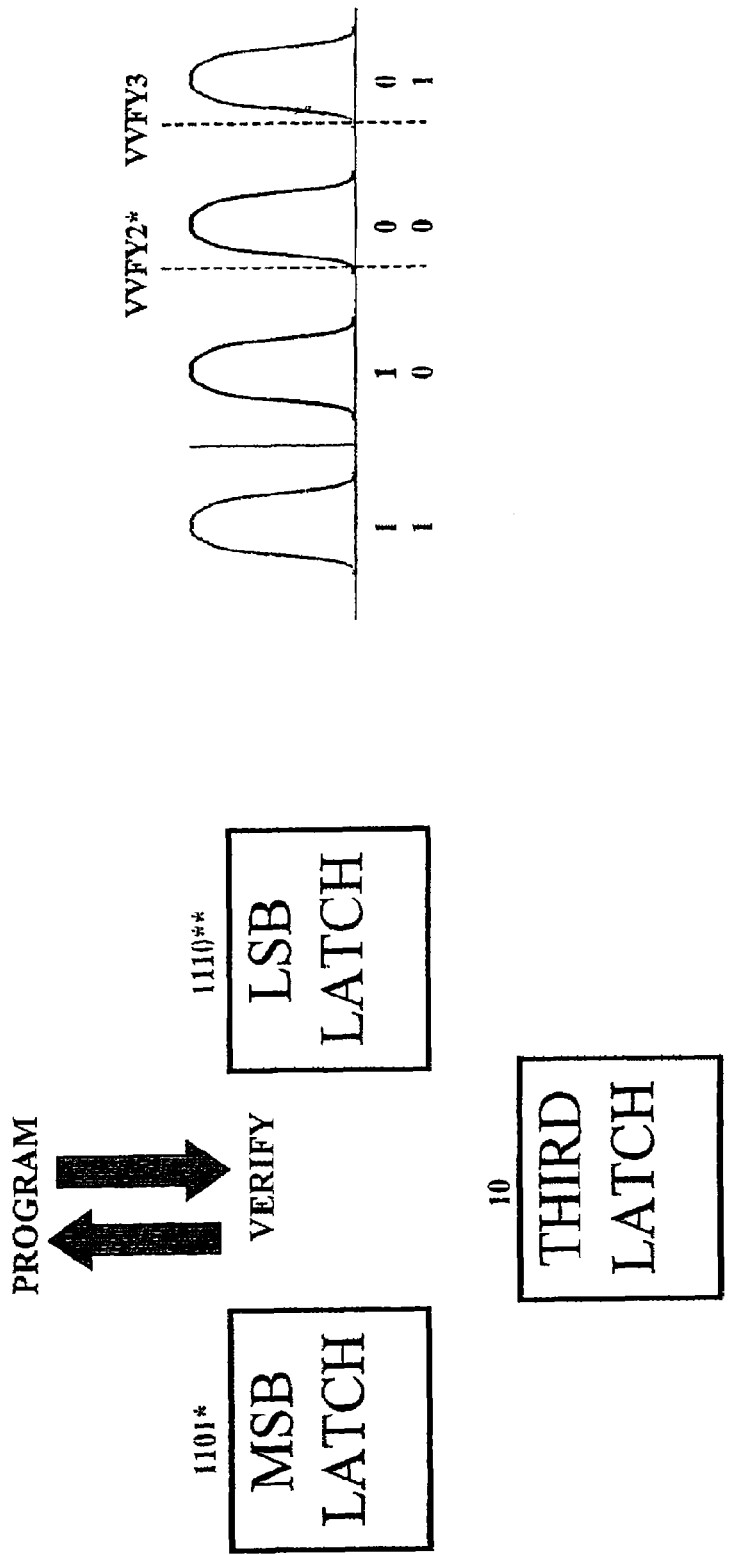
Figure 20:
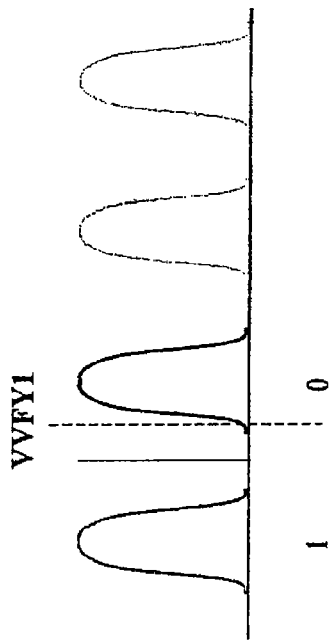
FIGS. 20 to 25 show method steps for programming and verifying the least significant bit of a two-bit datum to be stored in the memory cell according to a second embodiment of the invention.
Figure 20:
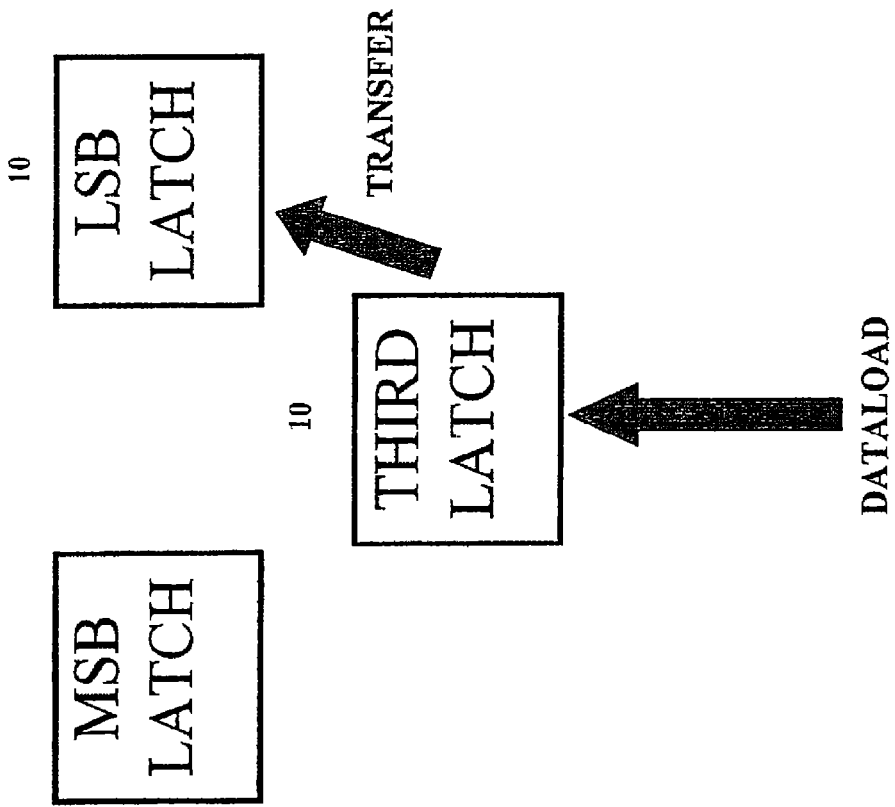
Figure 21:
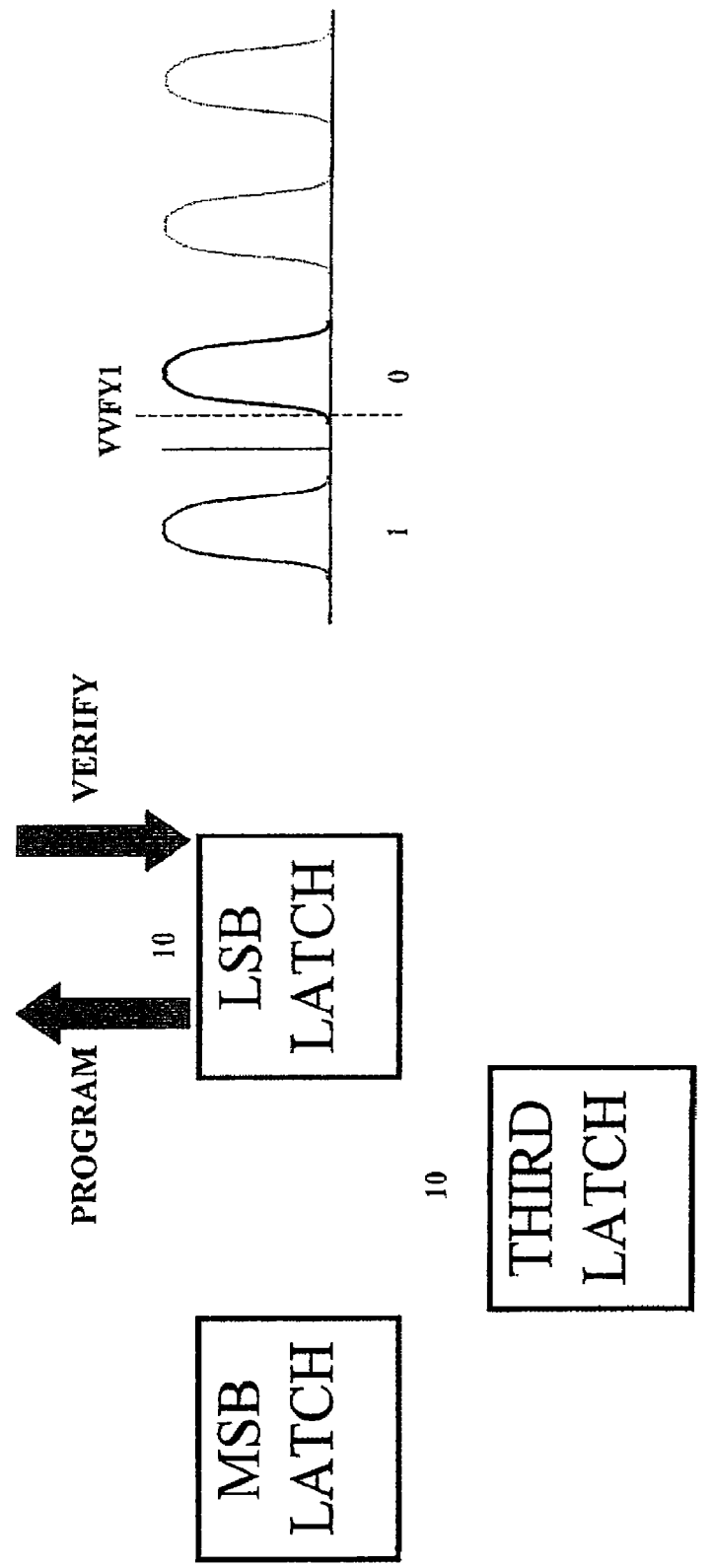
Figure 22:
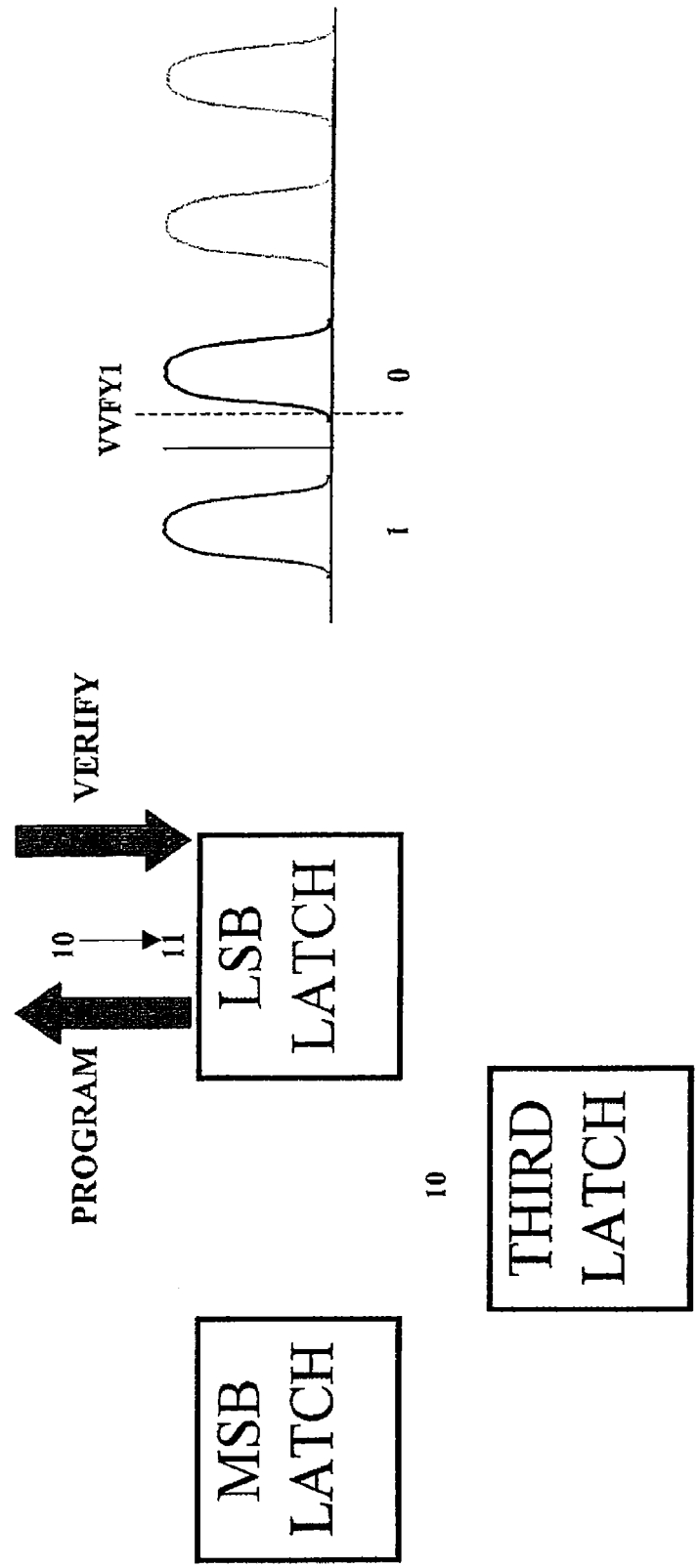
Figure 23:
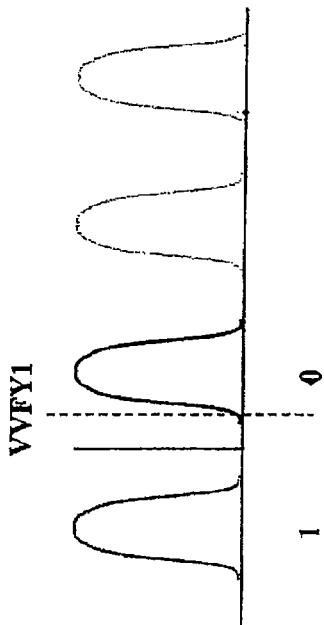
Figure 23:
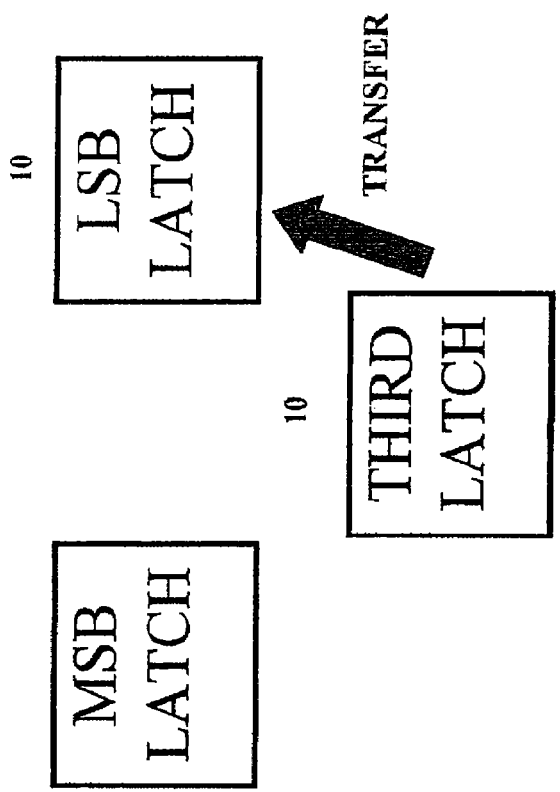
Figure 24:
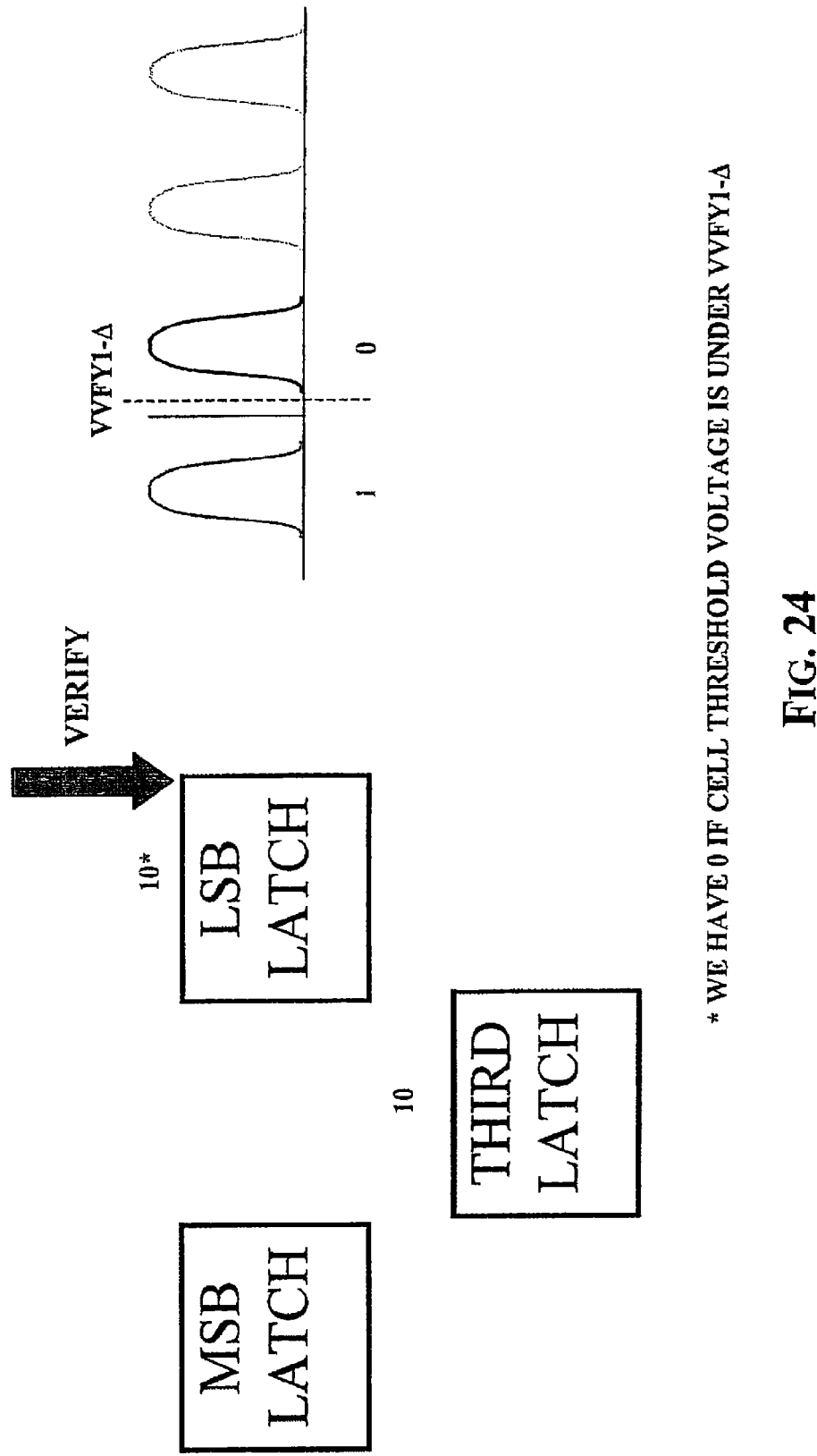
Figure 25:
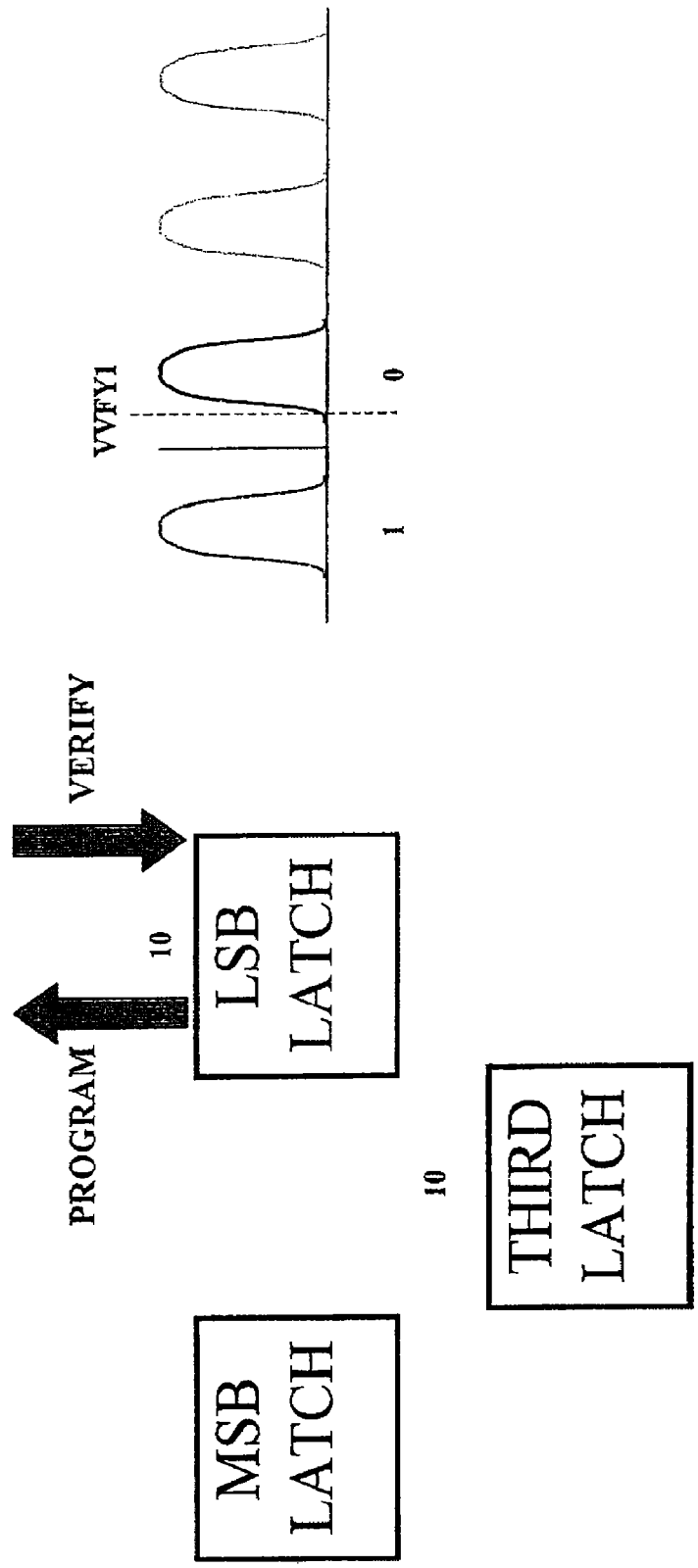

If the cell, read with the respective test read voltage, results to be programmed, a 1 is loaded in the latches LSB LATCH and MSB LATCH for inhibiting further program pulses from being applied to the cell (FIG. 19). Should a 0 be stored in the MSB LATCH and/or in the LSB LATCH, it means that the cell has not yet been correctly programmed. Further program pulses are applied to it up to achieve a threshold beyond the respective program voltage: VVFY2 or VVFY3.

In brief, according to this first embodiment, the method comprises two procedures for correctly programming the least significant bit and the most significant bit of a two-bit datum, respectively.

Figure 8:
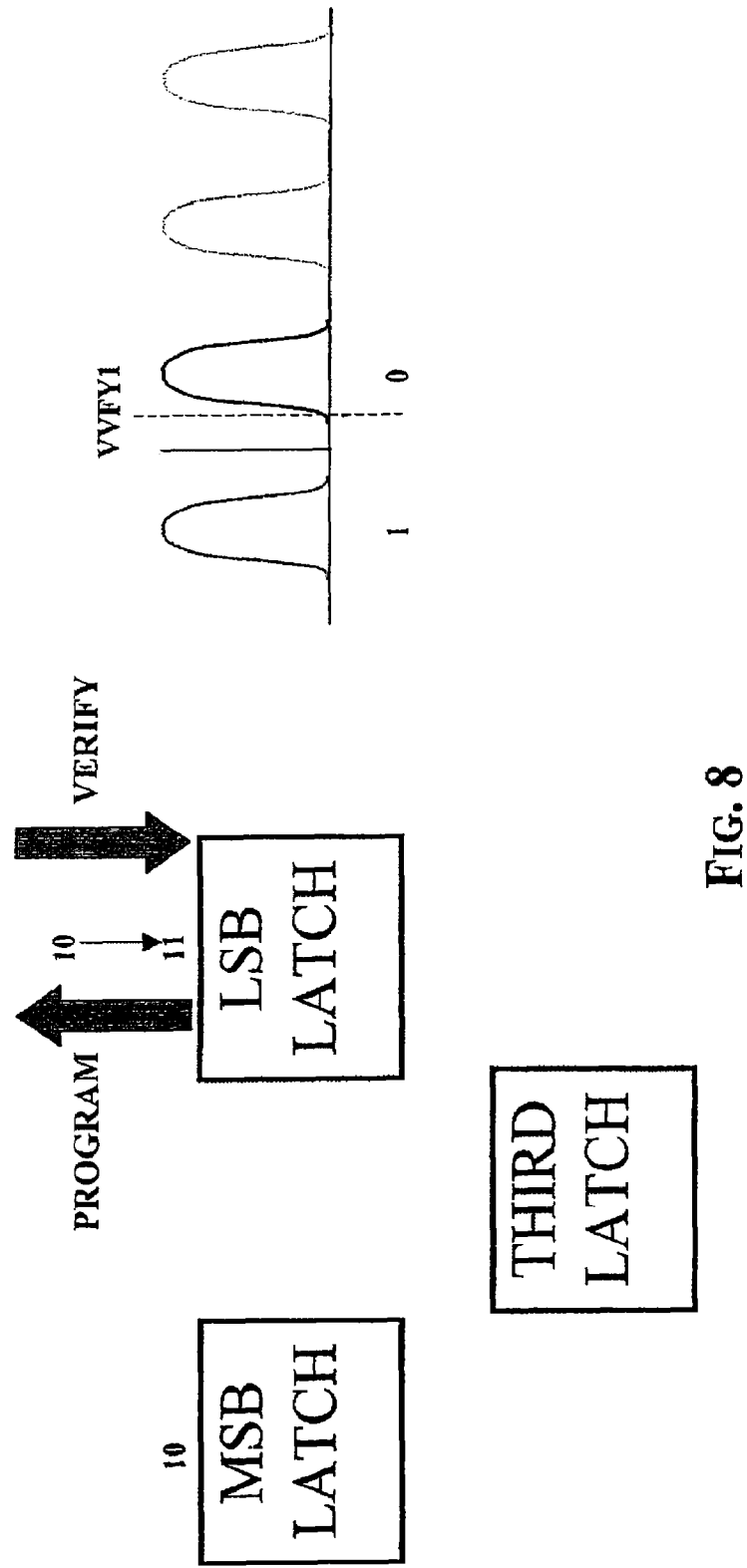

The procedure for programming the least significant bit (LSB) comprises the following steps:

A1 The LSB is programmed in the cell (FIGS. 6 to 8);

A2 The LSB value is recovered from the MSB LATCH were it is still stored (FIG. 9);

A3 The LSB programming is tested by reading the cell with a first test read voltage equal to the program voltage decreased by a certain quantity VVFY1-.DELTA. (FIGS. 10); and A4 If the test fails, further program pulses are applied in parallel also to the failed cell as far as making its threshold surpass the first program voltage VVFY1 (FIG. 11).

Figure 12:
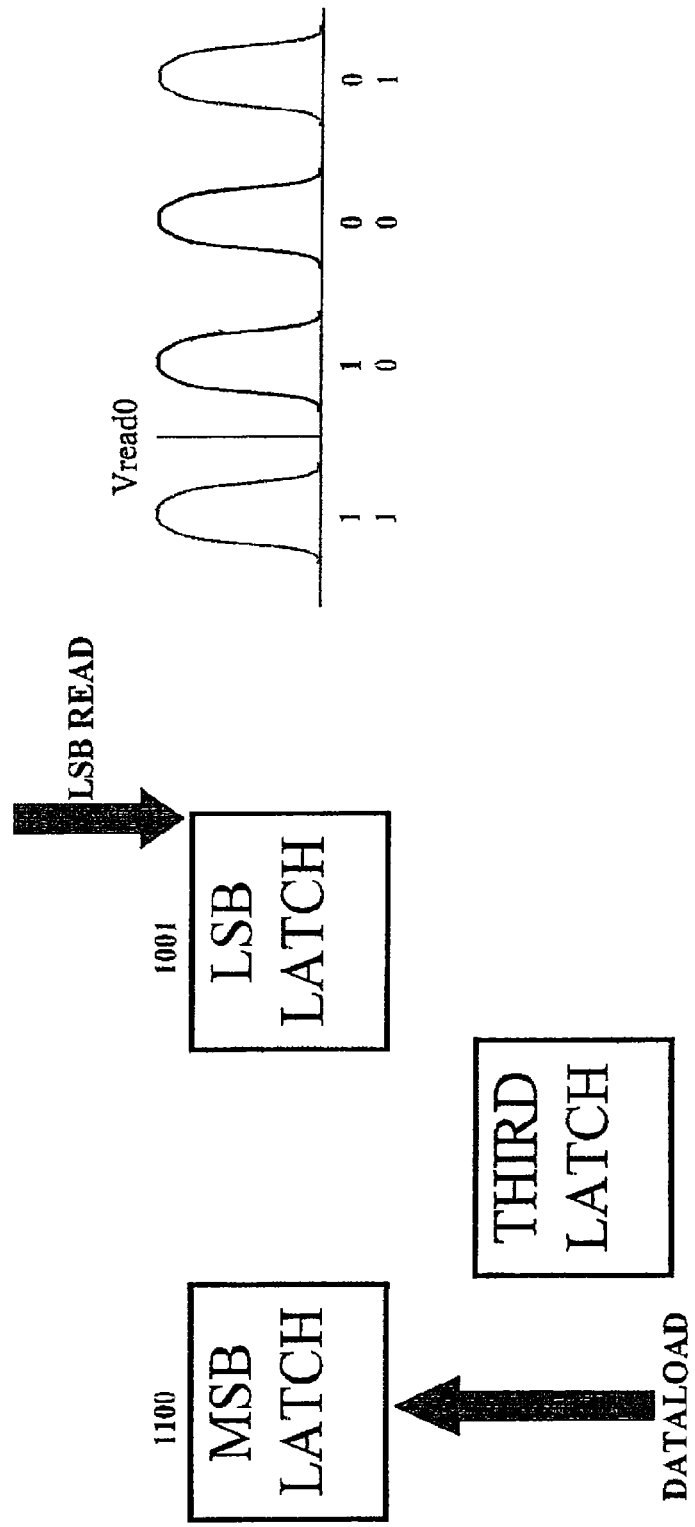
FIGS. 12 to 19 show method steps for programming and verifying the most significant bit of a two-bit datum to be stored in the memory cell according to the first embodiment of the invention.
Figure 13:
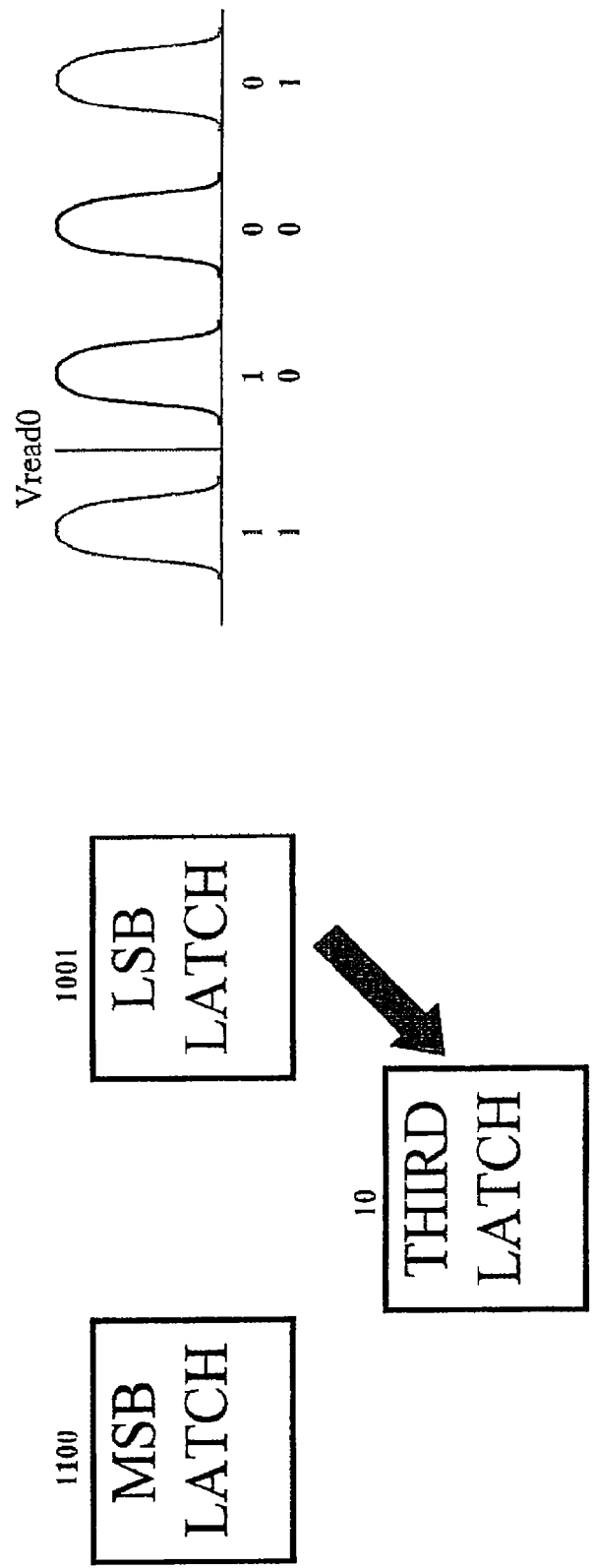
Figure 17:
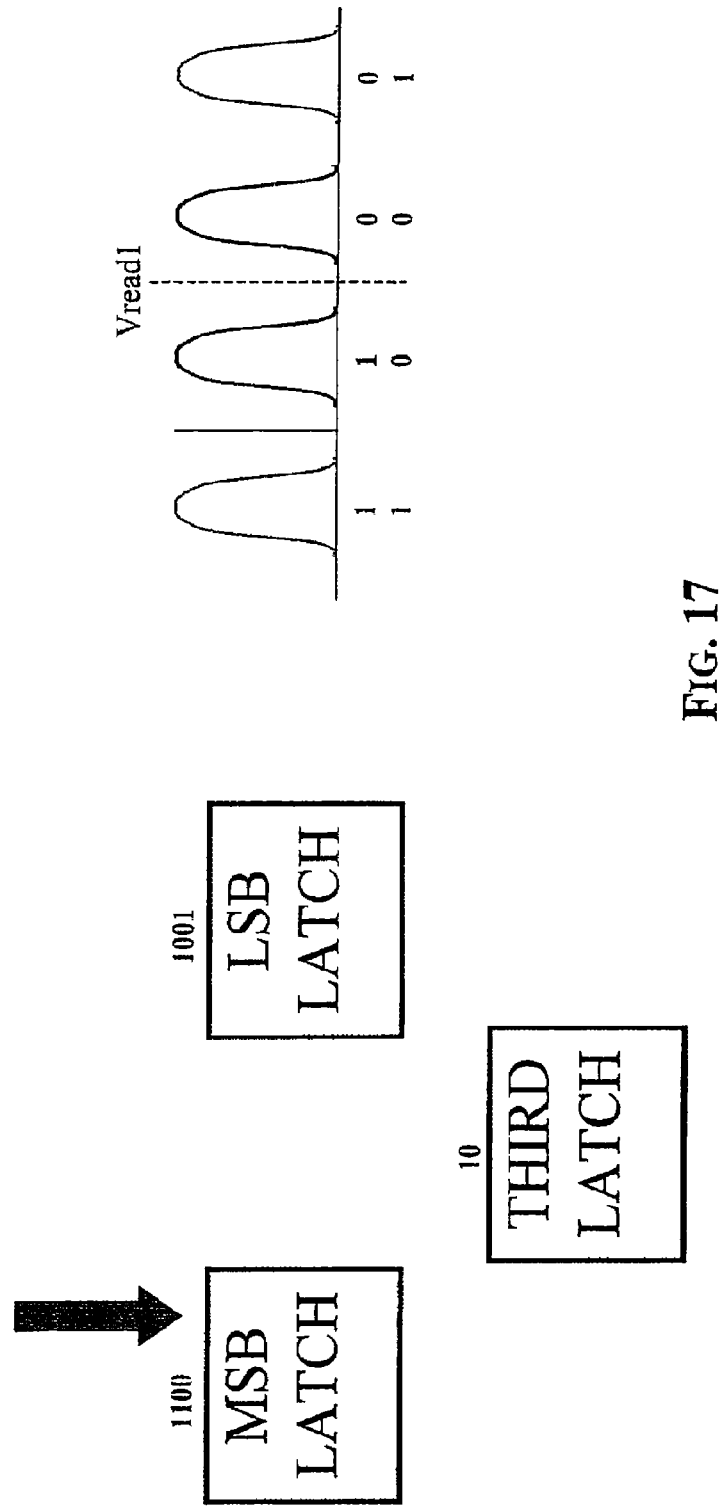

The procedure for programming the most significant bit (MSB) comprises the following steps:

B1 Retrieving the value of the programmed LSB by reading the cell using a first read voltage Vread0 (FIG. 12);

B2 Storing in an auxiliary latch the bit read in the previous step (FIG. 13);

B3 Applying program pulses to the cell up to make its threshold surpass a respective program voltage VVFY2 or VVFY3 depending on the LSB and the MSB (FIGS. 14 and 15);

B4 Copying in the LSB LATCH the bit stored in the auxiliary latch (FIG. 16);

B5 Retrieving the value of the programmed MSB by reading the cell with a second read voltage Vread1 and loading the read bit into the dedicated latch MSB LATCH (FIG. 17);

B6 Testing the reliability of the programming by reading the cell with a second VVFY2-.DELTA. or a third test read voltage VVFY3-.DELTA smaller than or equal to the respective second or third program voltage VVFY2 or VVFY3 (FIGS. 18); and B7 If the test at the previous step fails, programming pulses are supplied in parallel to the failed cell up to surpass the respective program voltage (FIG. 19).

Second Embodiment

In the second embodiment, the procedure for programming the least significant bit LSB comprises substantially the same steps A1 to A4 of the first embodiment. The method steps illustrated in FIGS. 20 to 25 correspond to that illustrated in FIGS. 6 to 11, with the sole difference that the auxiliary latch THIRD LATCH plays the role of the latch MSB LATCH.

The procedure for programming the most significant bit is slightly different from that of the first embodiment because the auxiliary latch THIRD LATCH is used for storing the most significant bit and not the least significant bit.

Figure 26:
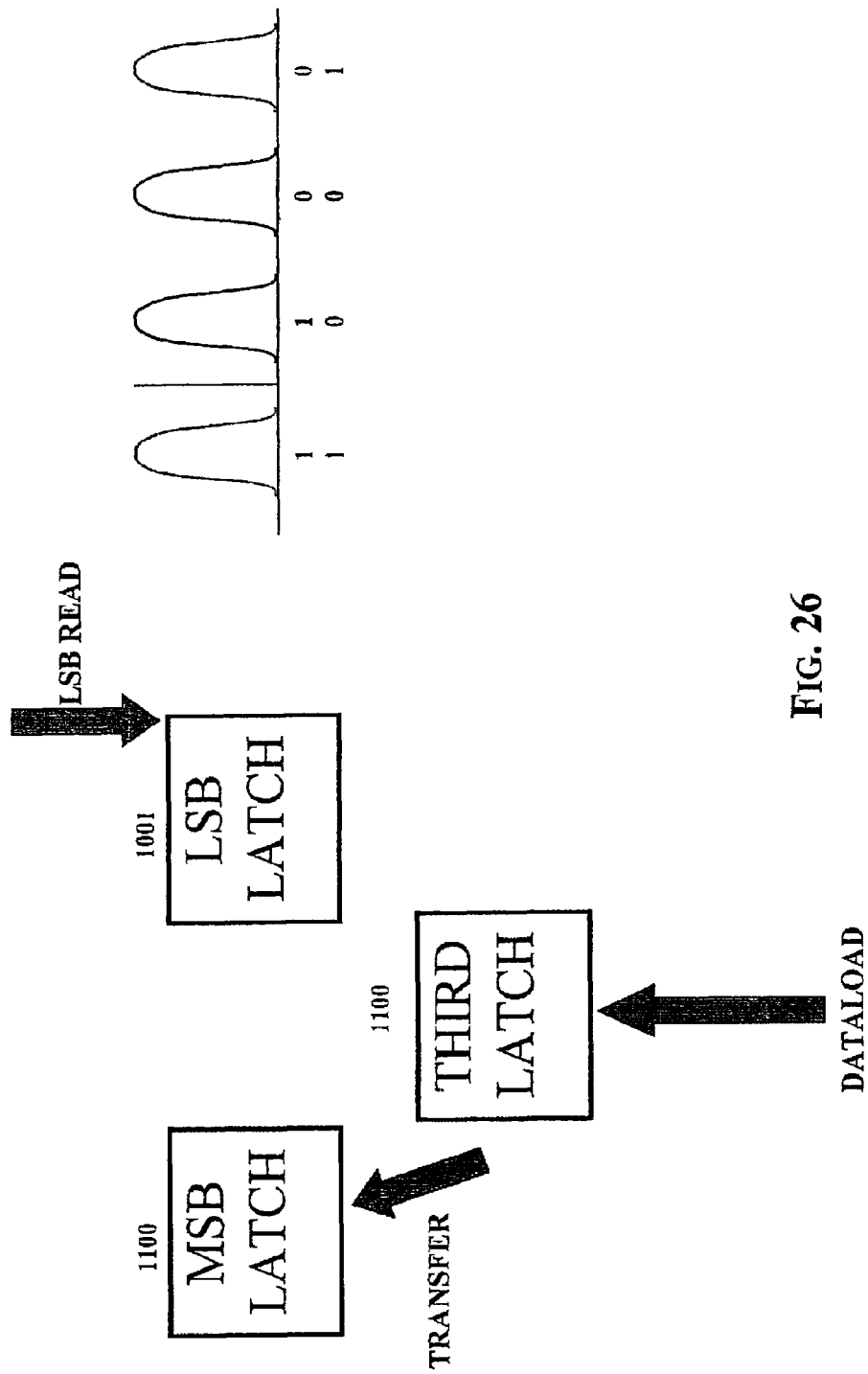
FIGS. 26 to 32 show method steps for programming and verifying the most significant bit of a two-bit datum to be stored in the memory cell according to the second embodiment of the invention.
Figure 27:
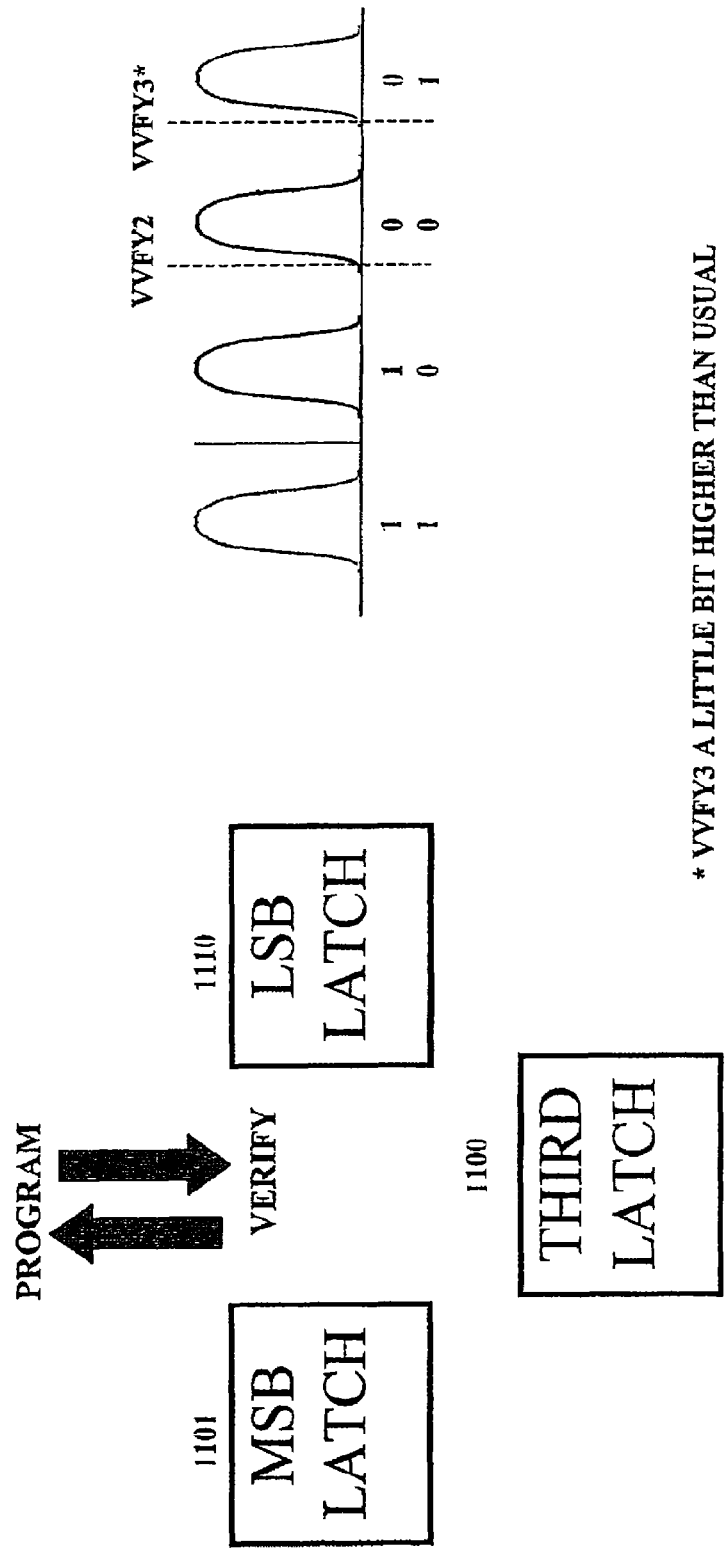
Figure 28:
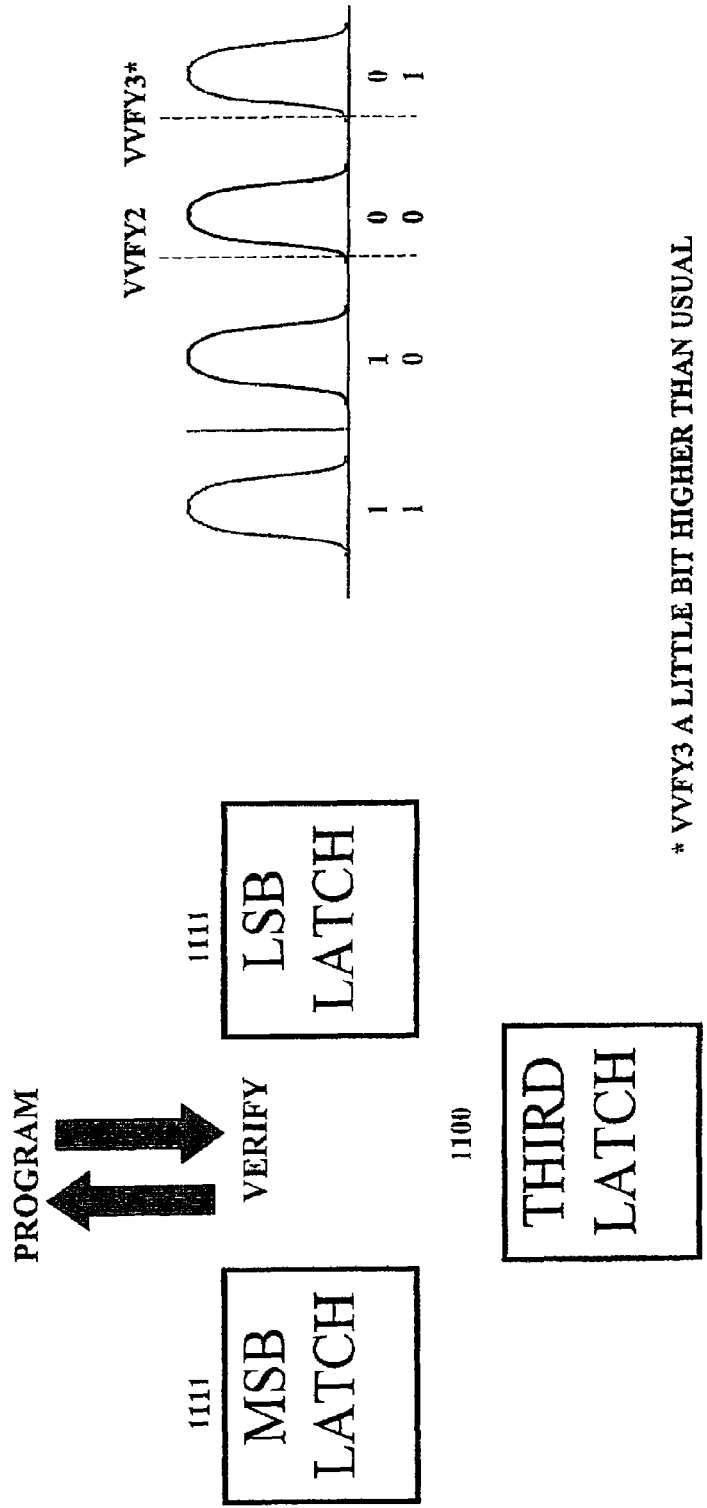
Figure 29:
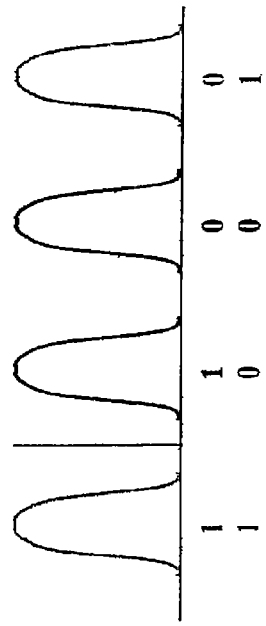
Figure 29:
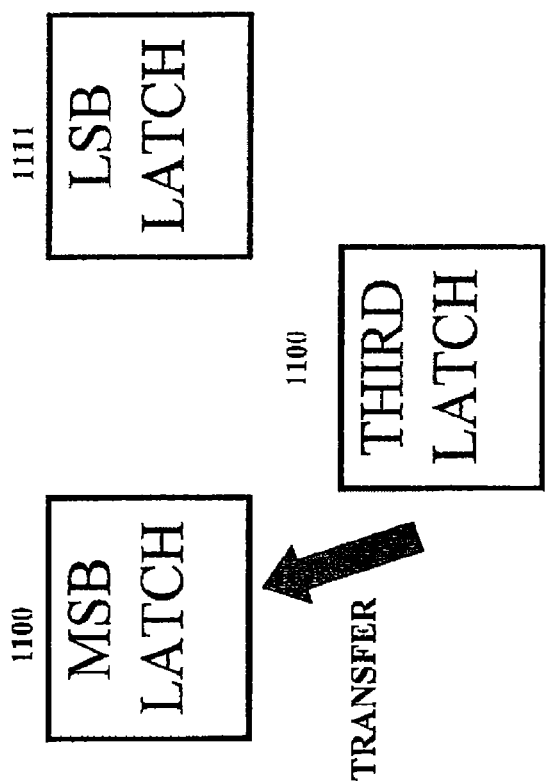
Figure 30:
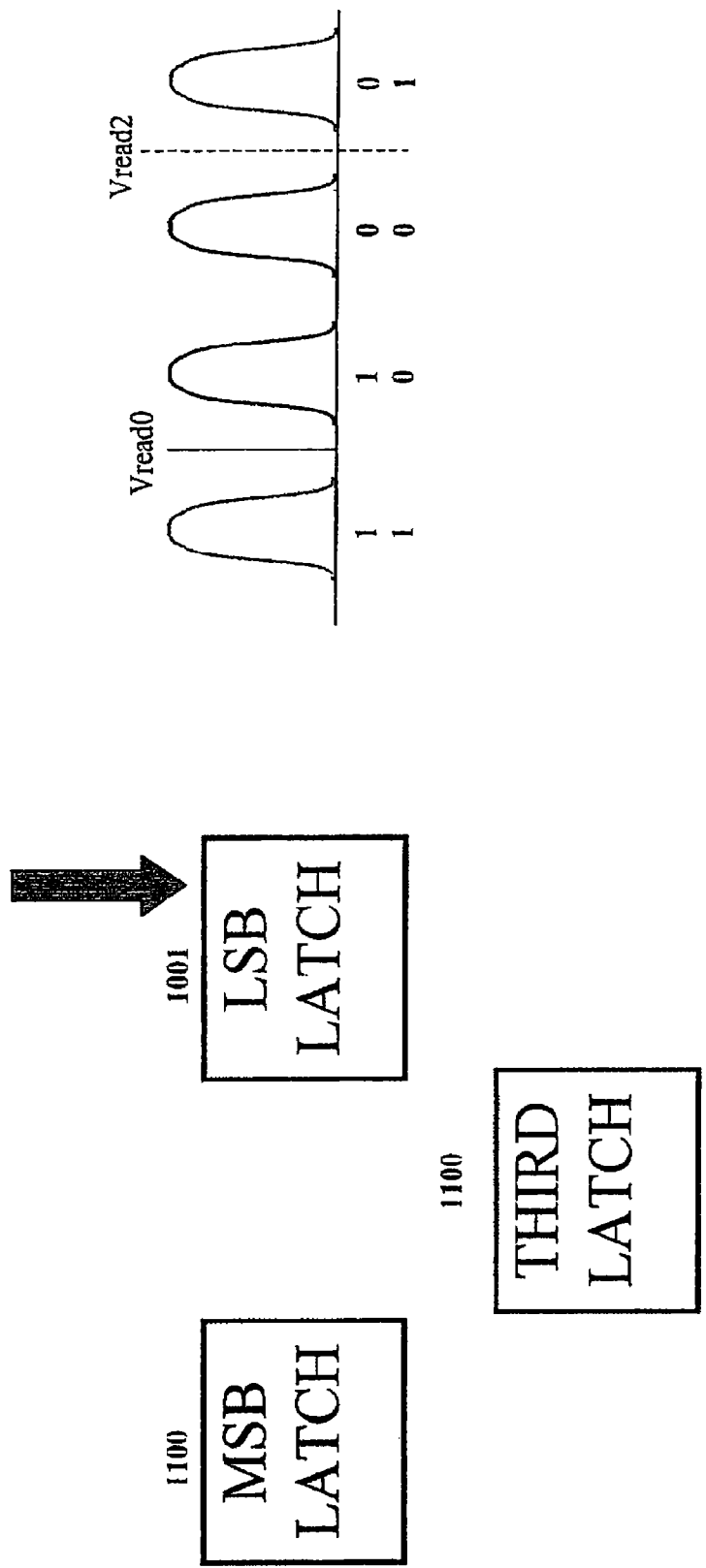

The most significant bit is first written into the auxiliary latch THIRD LATCH and then it is transferred to the corresponding latch MSB LATCH (FIG. 26), then the step B1 is carried out. The step B3 is executed through the operations illustrated in FIGS. 27 and 28 that correspond to FIGS. 14 and 15. Then the following steps are carried out:

B4 Copying in the MSB LATCH the bit stored in the auxiliary latch (FIGS. 29); and B5 Retrieving the least significant bit by reading the cell with a first read voltage Vread0 and a third read voltage Vread2 and loading the read bit into the latch LSB LATCH (FIG. 30).

In the second embodiment the least significant bit is read at step B5.

Figure 31:
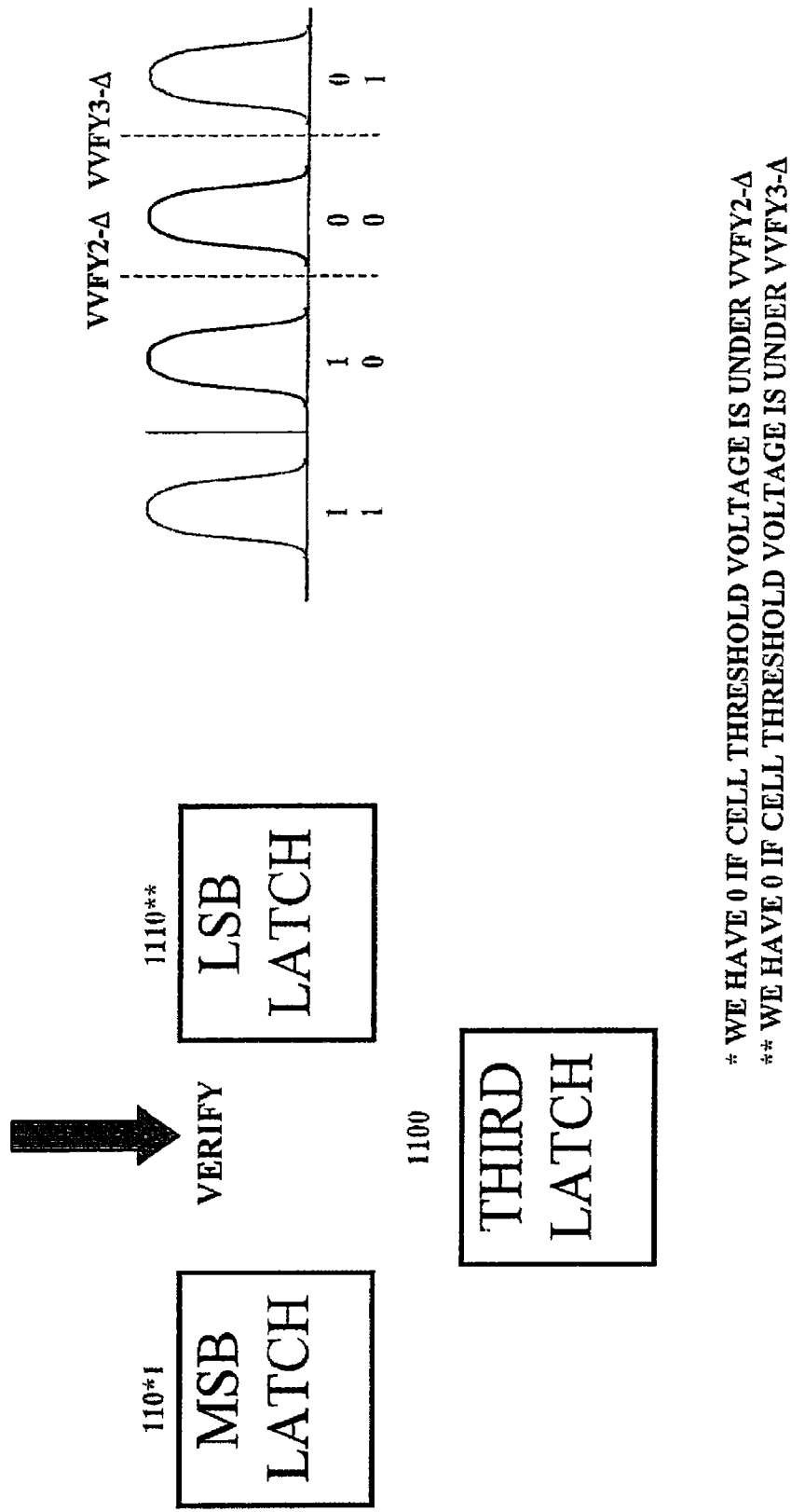
Figure 32:
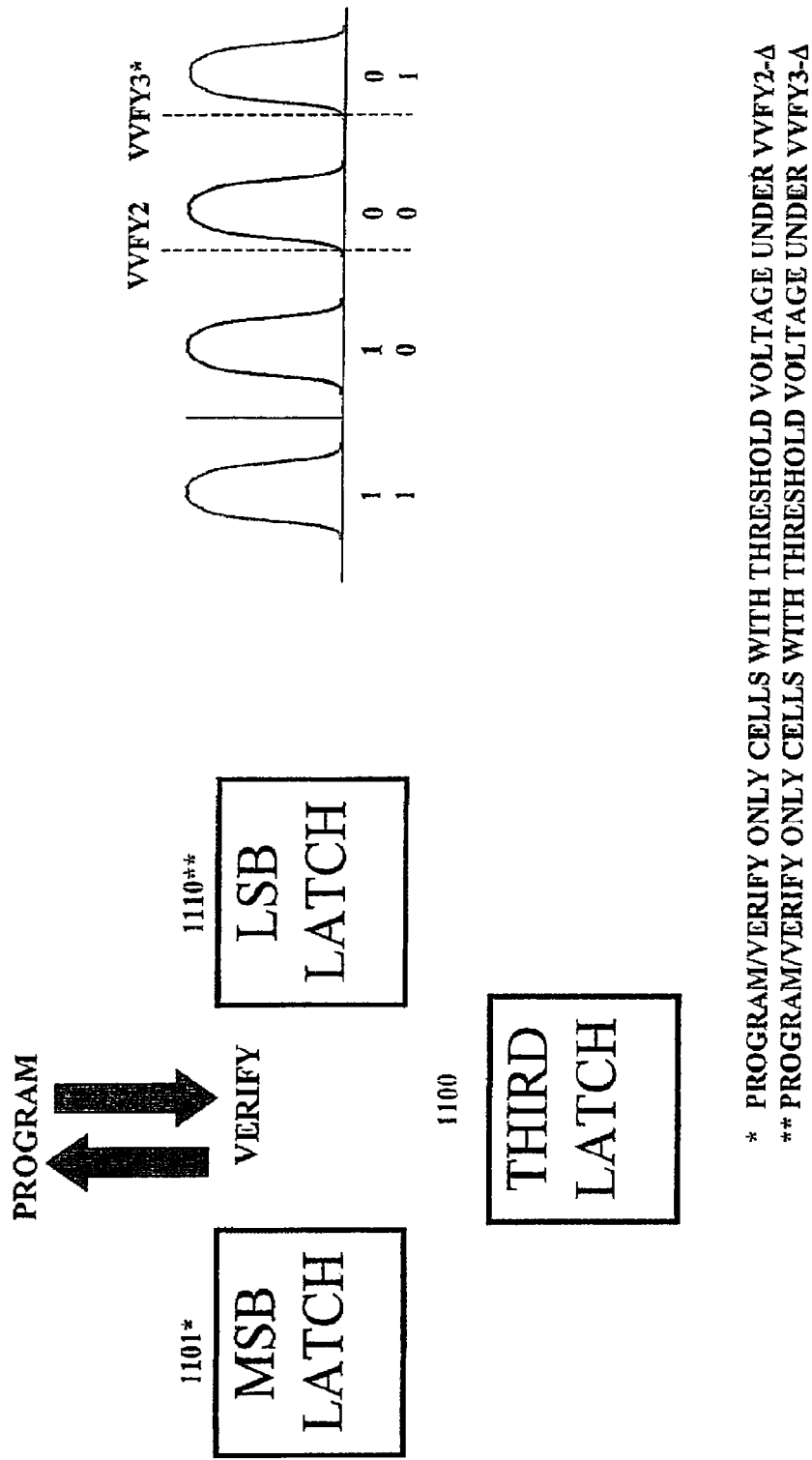
Figure 33:
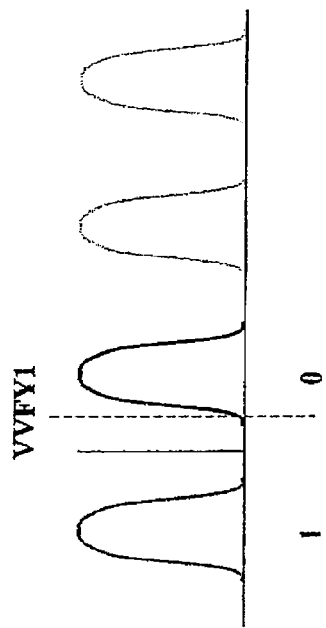
FIGS. 33 to 38 show method steps for programming and verifying the least significant bit of a two-bit datum to be stored in the memory cell according to a preferred embodiment of the invention.
Figure 33:
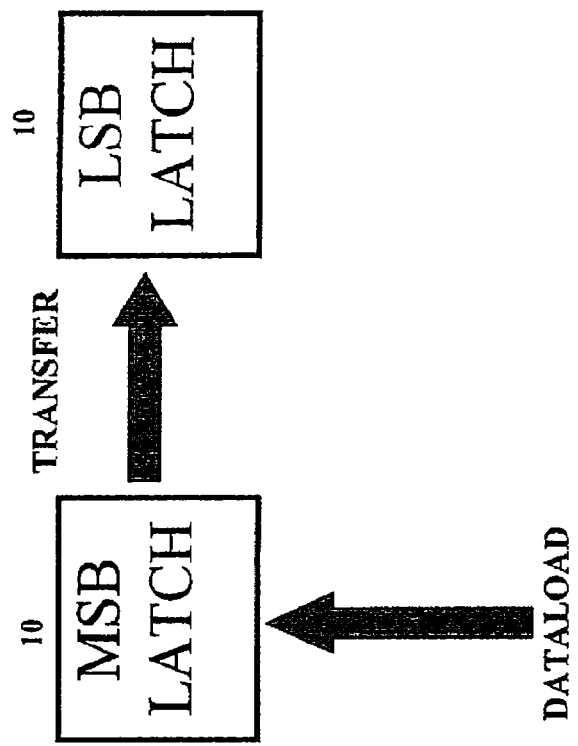
Figure 34:
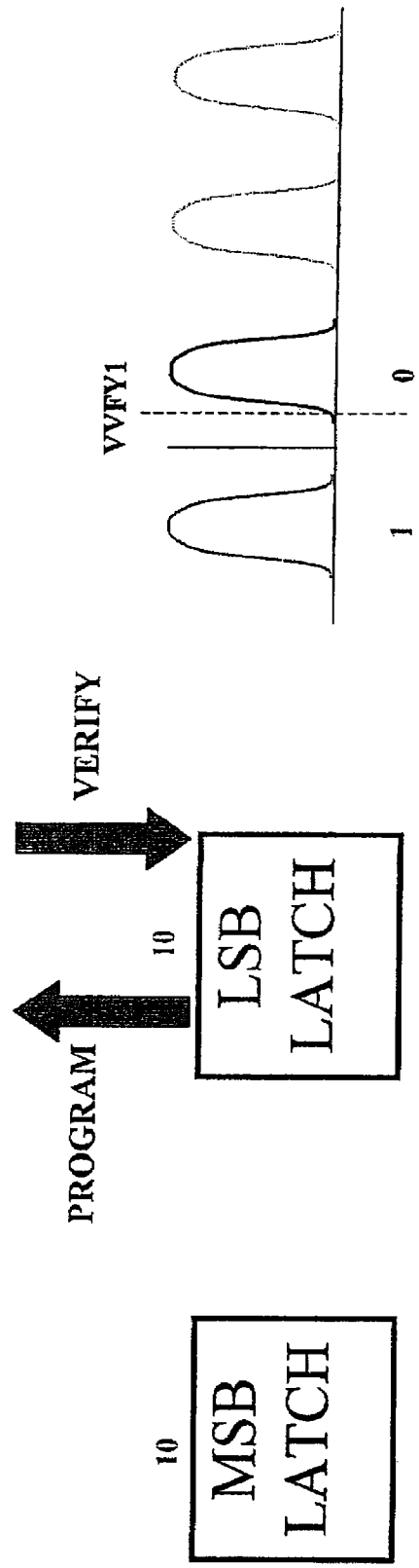
Figure 35:
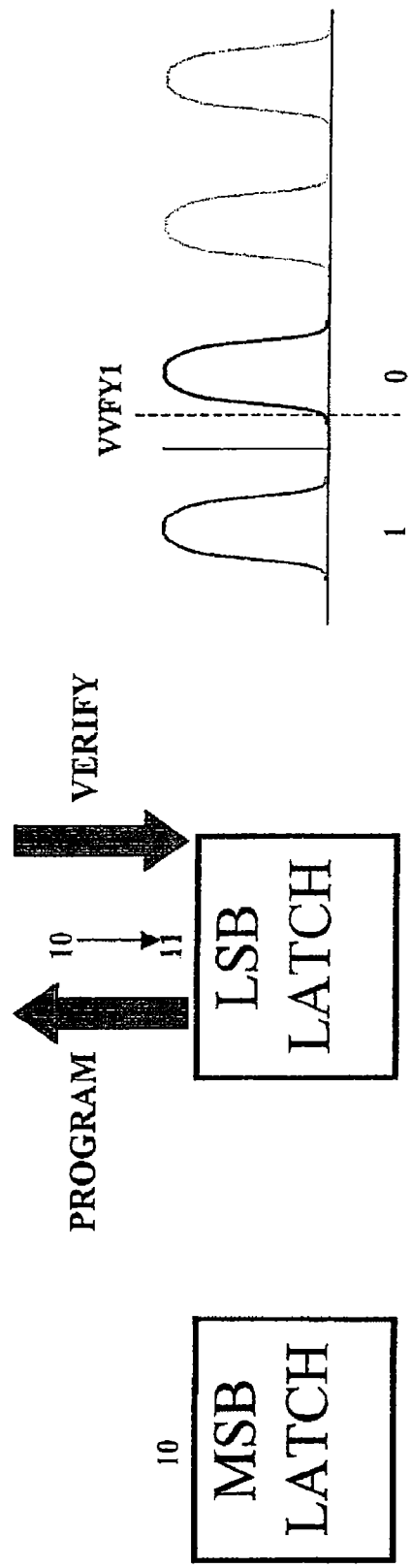
Figure 36:
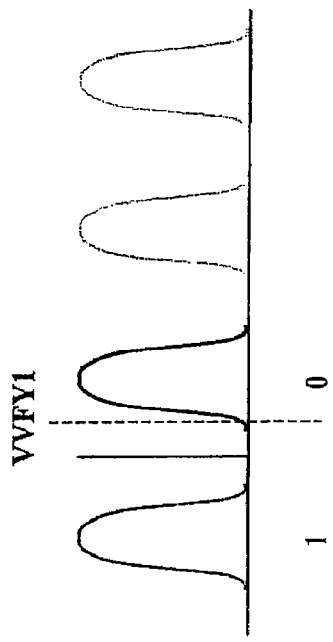
Figure 36:
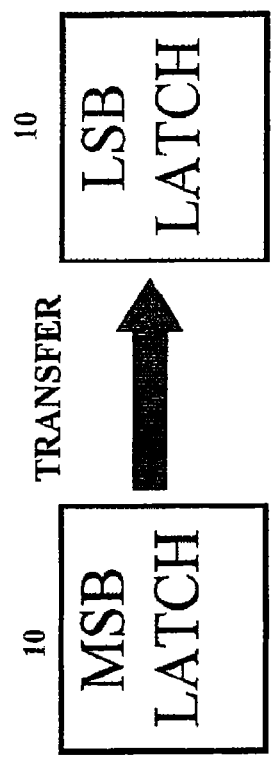
Figure 37:
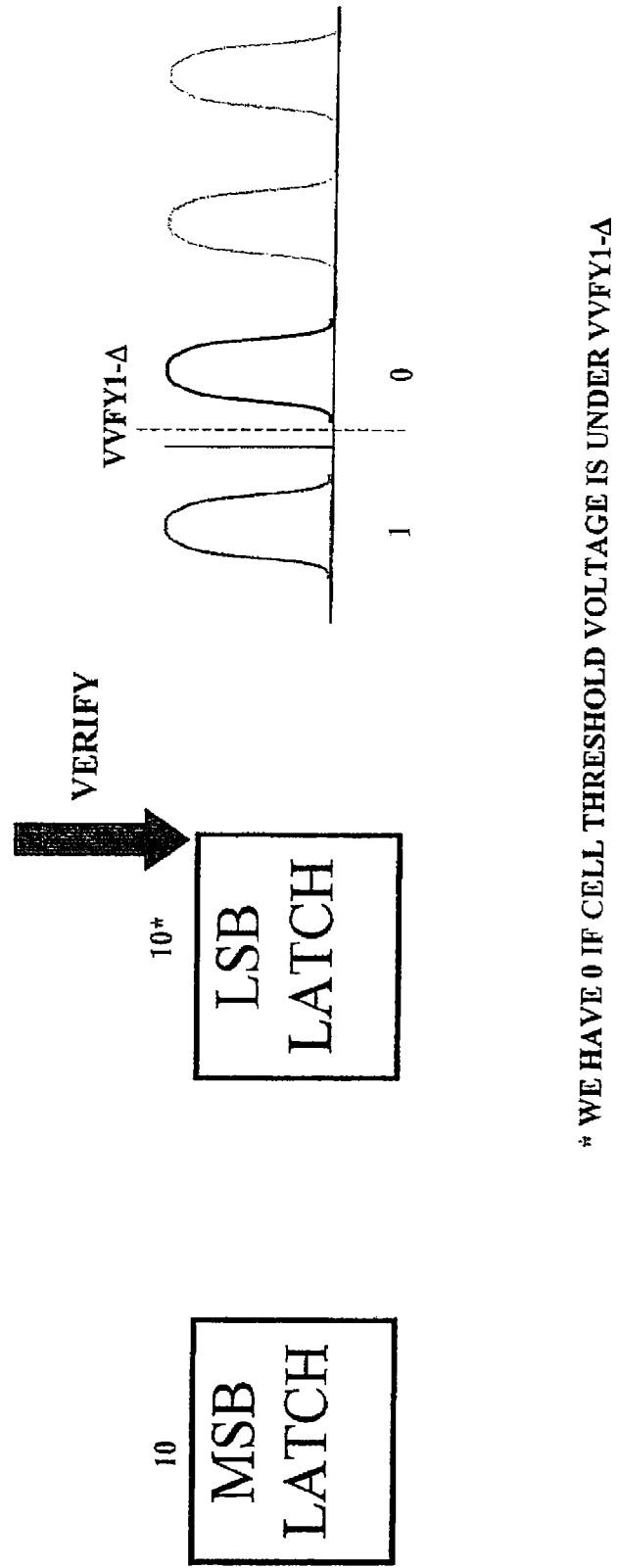
Figure 38:
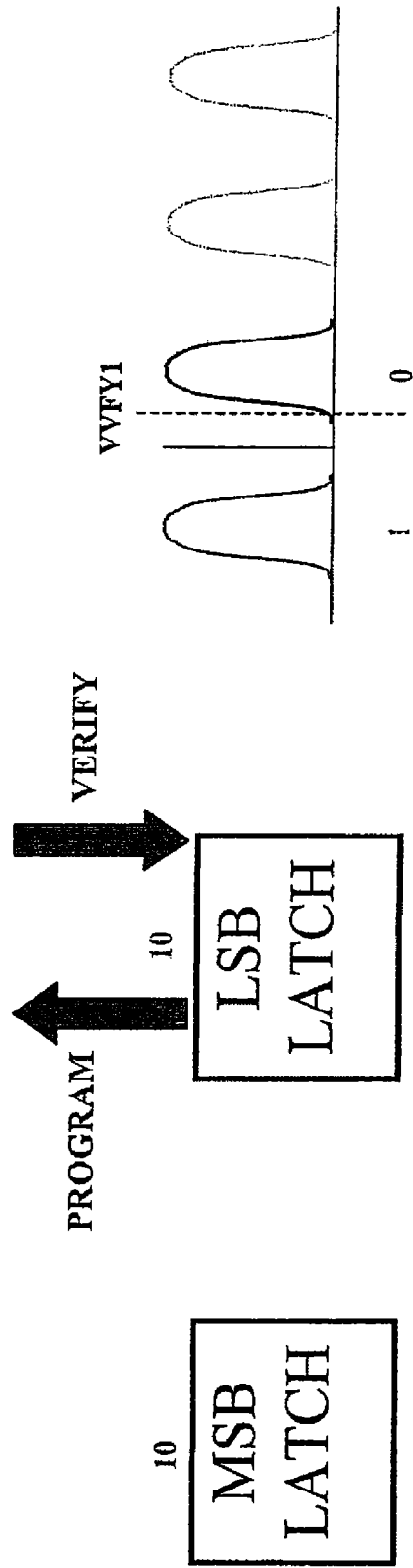

The steps B6 and B7 are carried out as in the first embodiment, as illustrated in FIGS. 31 and 32, respectively, which correspond to FIGS. 18 and 19.

Both embodiments require an auxiliary latch THIRD LATCH used for storing the least significant bit in the first embodiment, or the most significant bit in the second embodiment. The other bit not stored into the auxiliary latch is read using an appropriate read voltage.

Third Embodiment

In this embodiment no auxiliary latch is required because both the least significant bit and the most significant bit are read using appropriate read voltages. As shown in FIGS. 33 to 38, the steps A1 to A4 of the procedure for programming the least significant bit are exactly the same as in the first embodiment.

Figure 39:
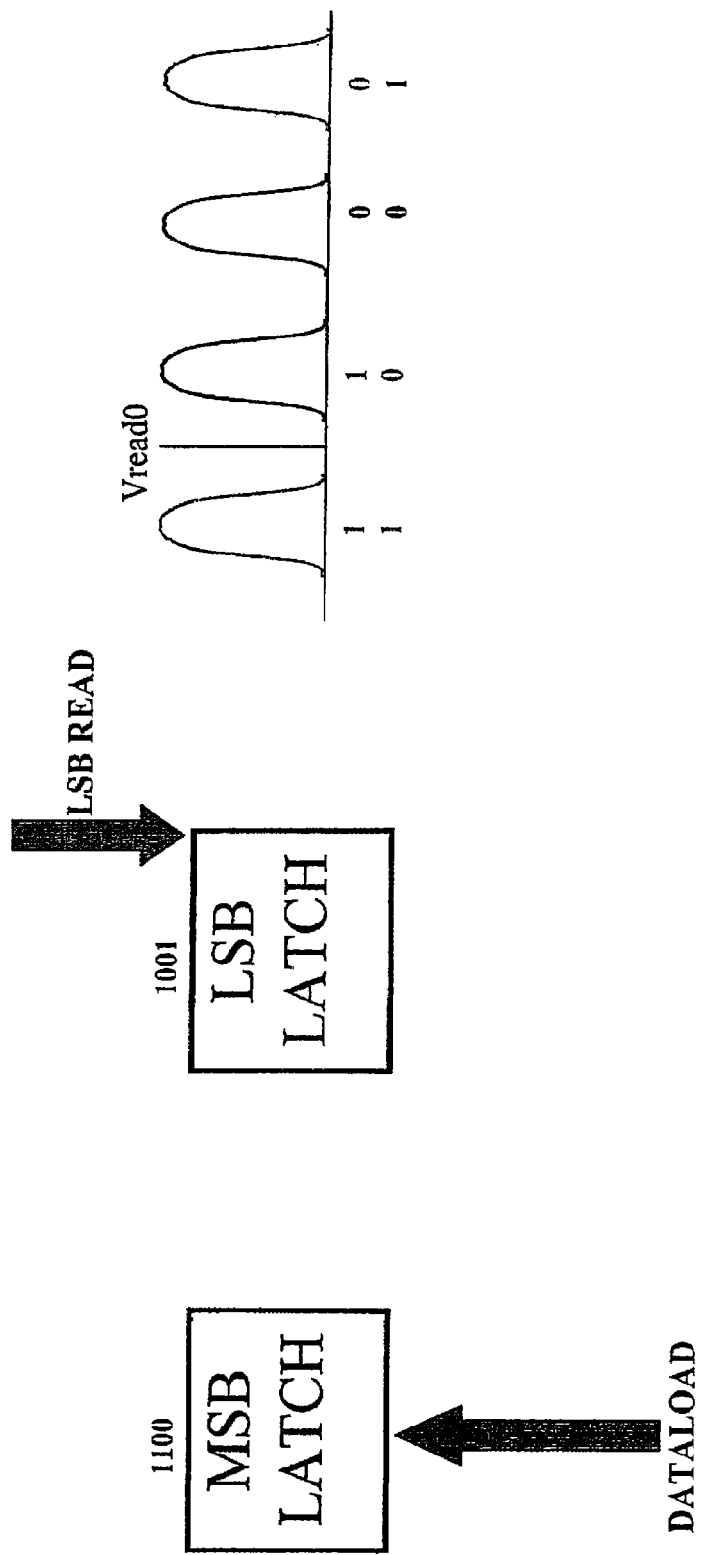
FIGS. 39 to 45 show method steps for programming and verifying the most significant bit of a two-bit datum to be stored in the memory cell according to the preferred embodiment of the invention.
Figure 40:
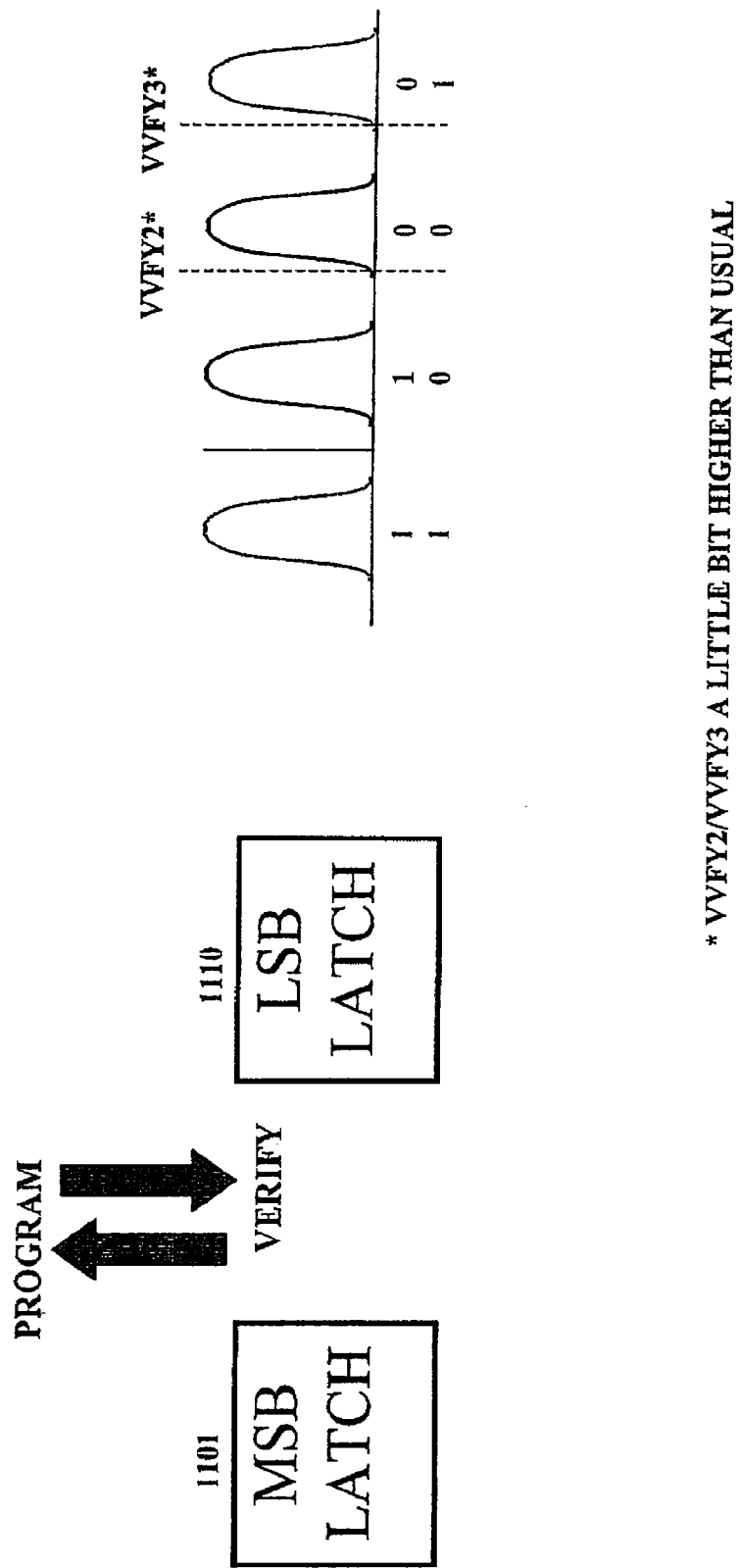
Figure 41:
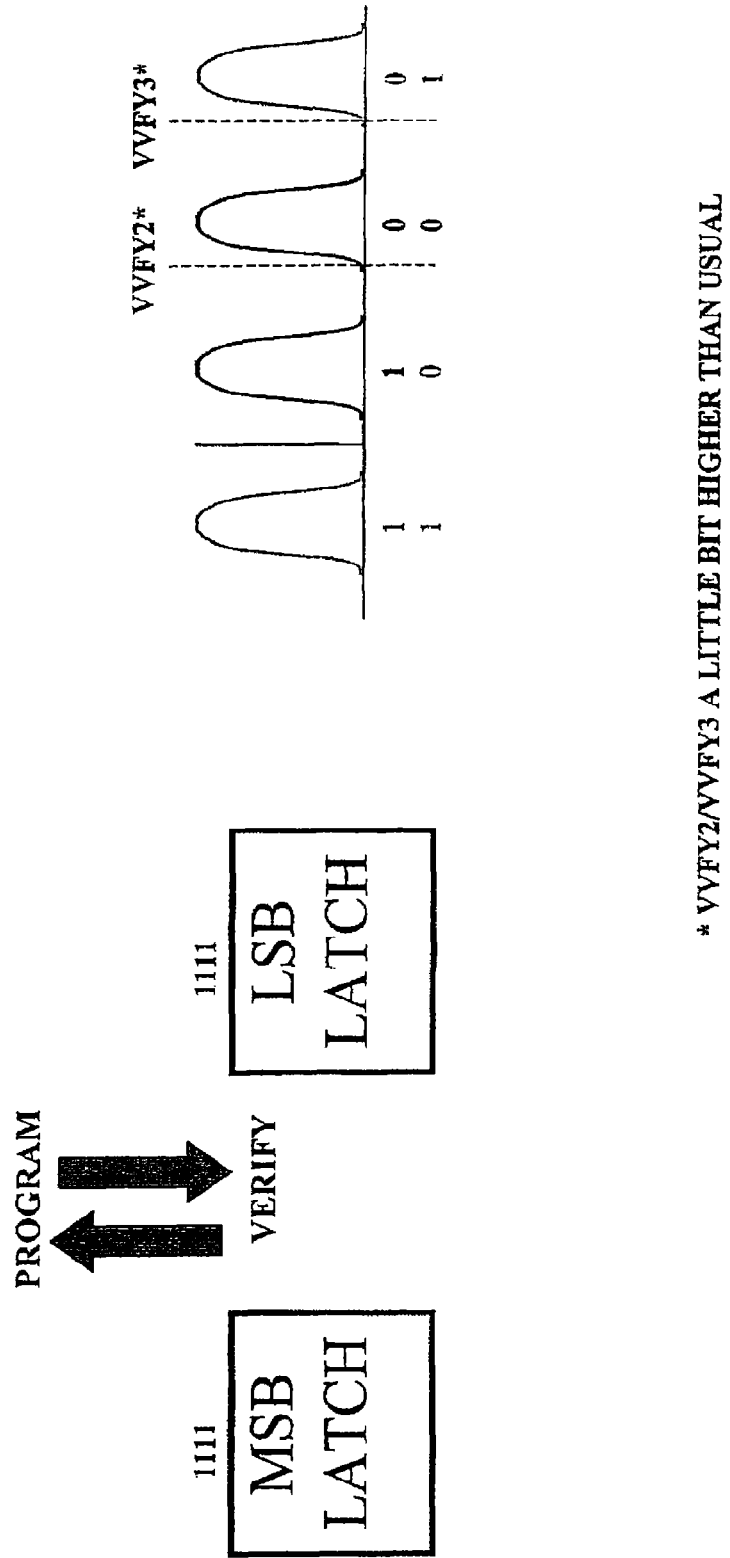

As far as the procedure for programming the most significant bit is concerned, the step B1 is the same as in the first embodiment as illustrated in FIG. 39. The step B2 is not carried out because there is no auxiliary latch, and the step B3 is identical as in the first embodiment as illustrated in FIGS. 40 and 41.

Figure 42:
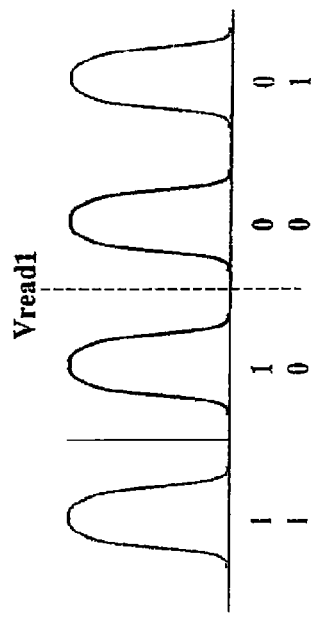
Figure 42:
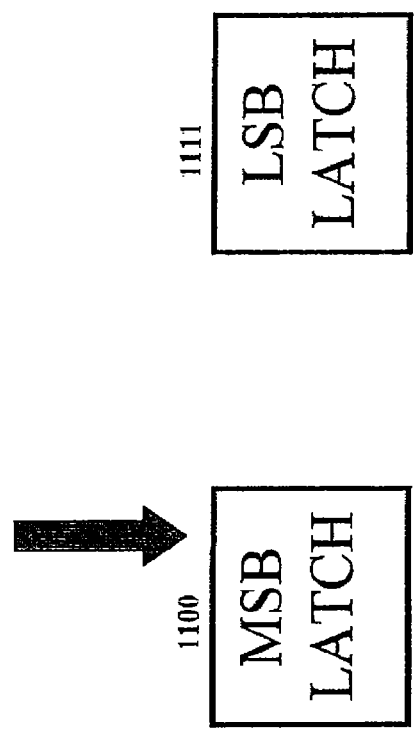
Figure 43:
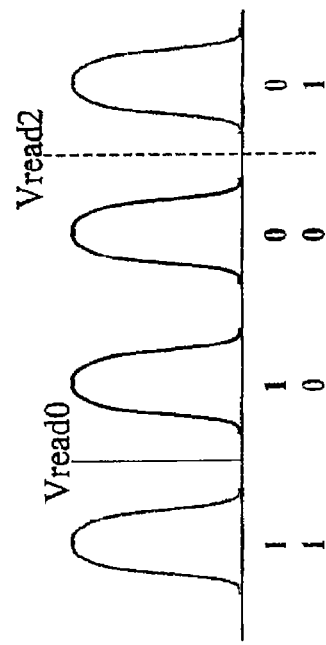
Figure 43:
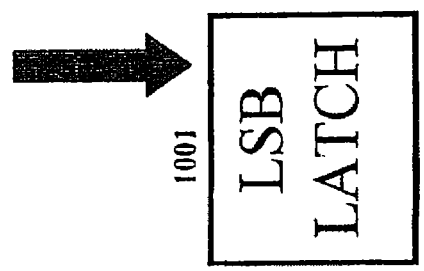
Figure 43:
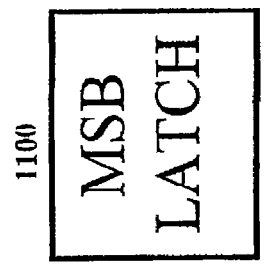
Figure 44:
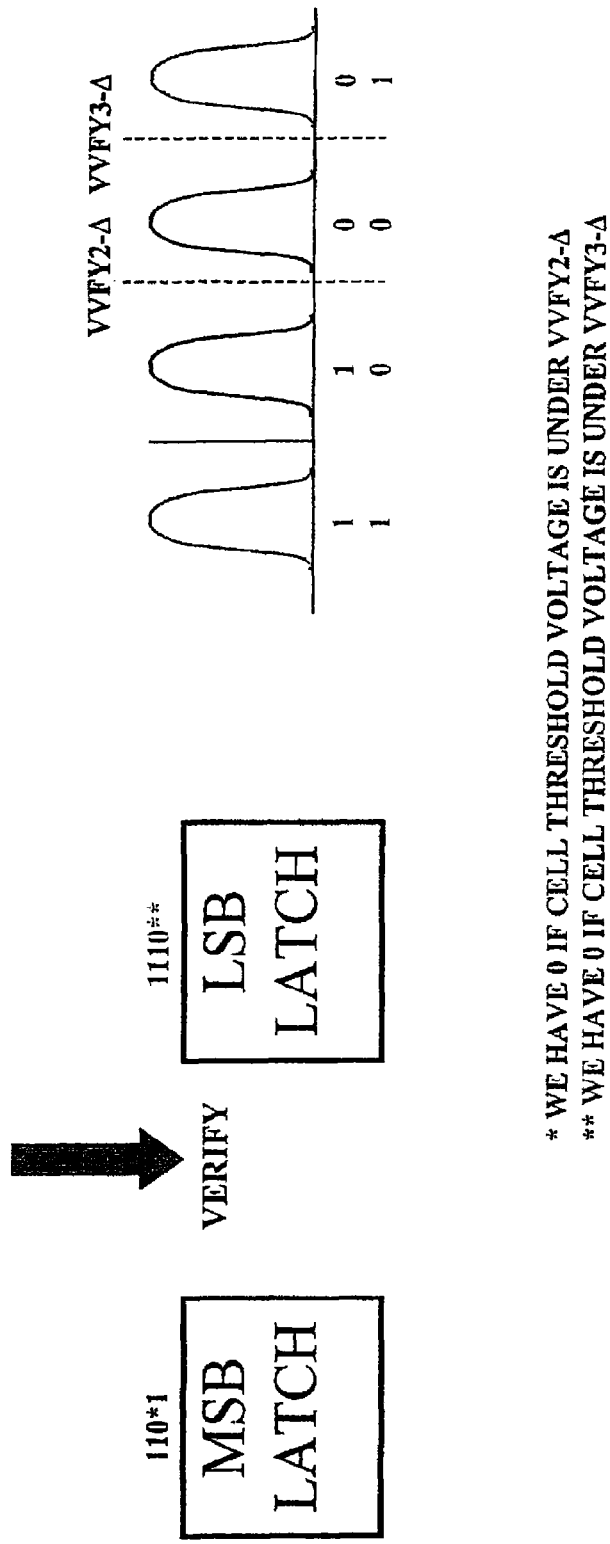
Figure 45:
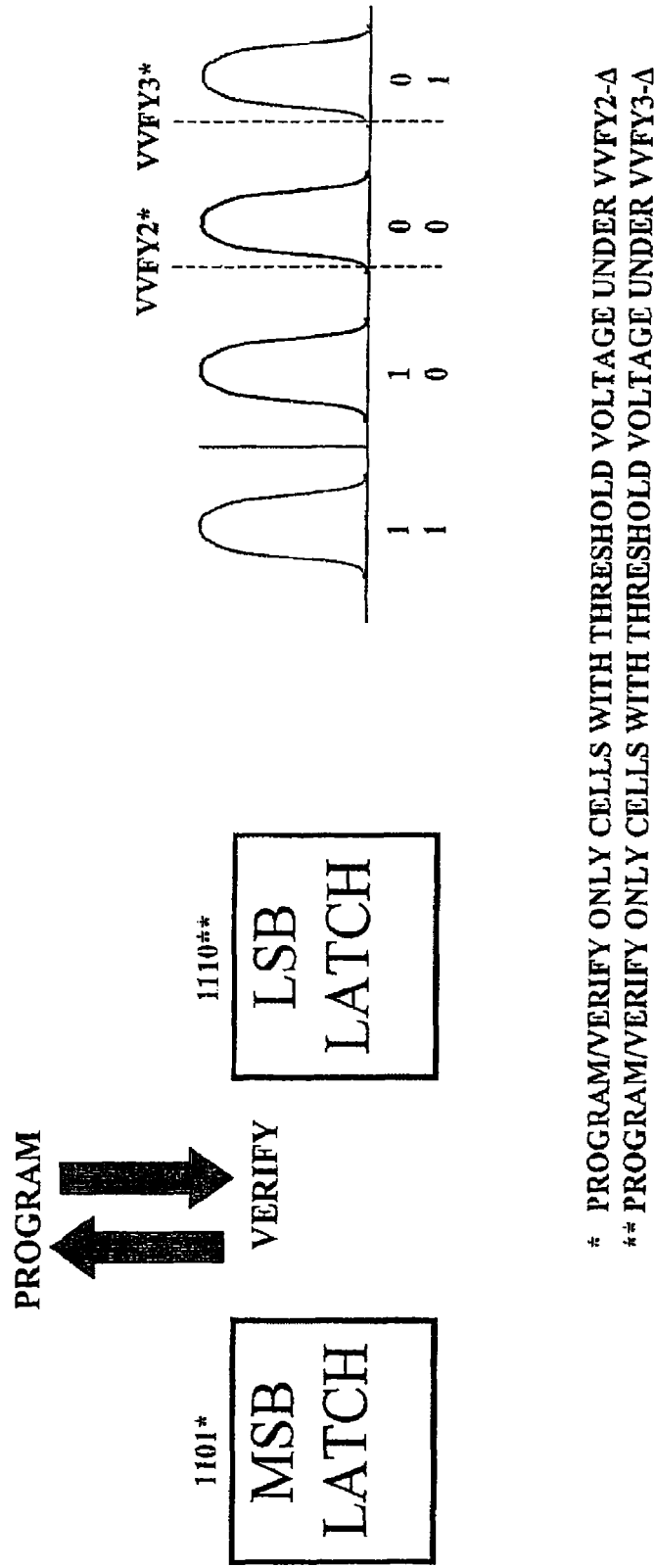

The least and the most significant bit are retrieved by executing the steps B5 of the first embodiment as illustrated in FIG. 42, and the step B5 of the second embodiment as illustrated in FIG. 43, The steps B6 and B7 are carried out as in the first embodiment as illustrated in FIGS. 44 and 45, respectively.

Figure 46:
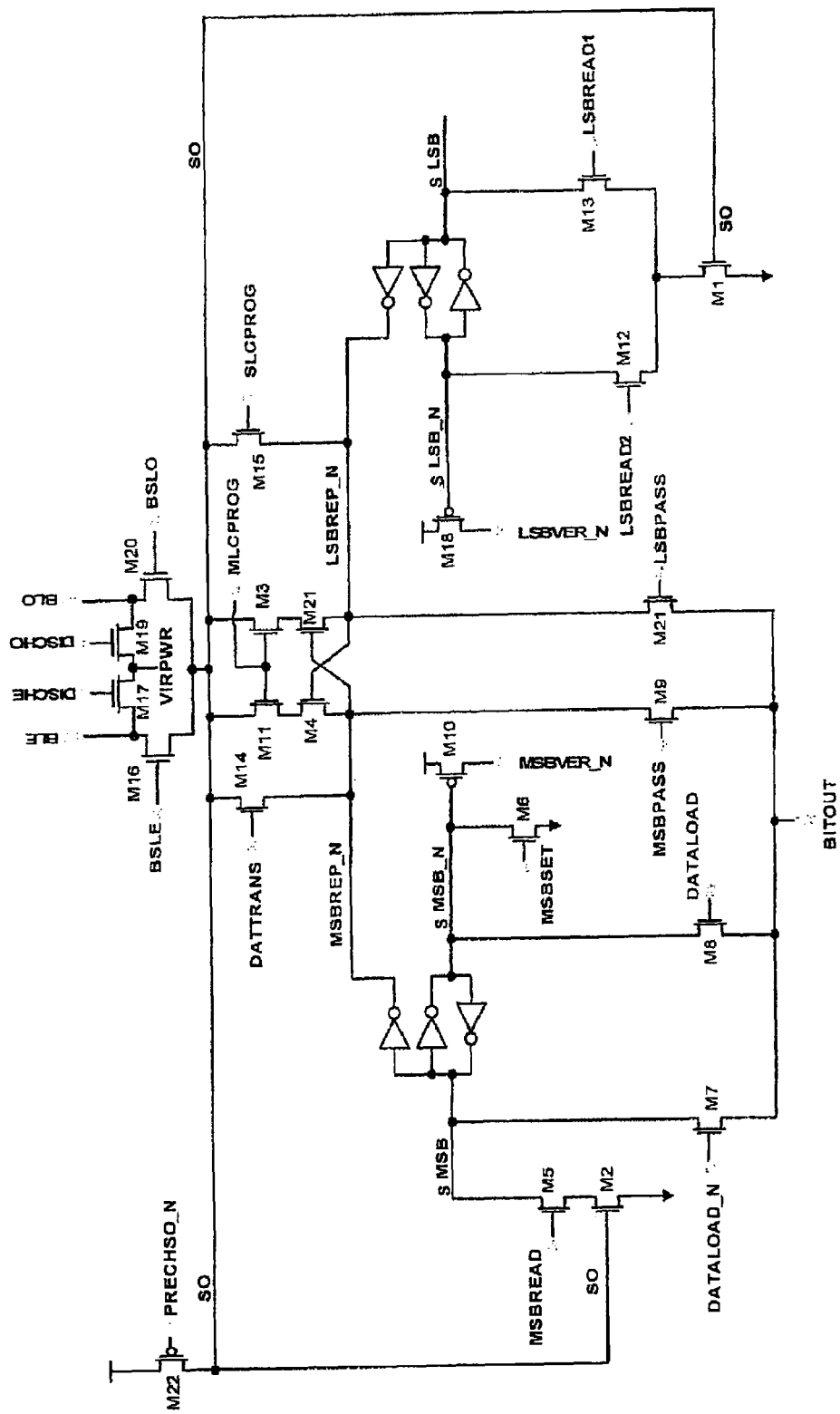
FIG. 46 depicts the page buffer disclosed in European Patent Application No. 05106972.2.

The third embodiment may be implemented by the page buffer circuit disclosed in European Patent Application No 05106972.2, which is assigned to the current assignee of the present invention. This embodiment is schematically depicted in FIG. 46. The meaning of each label is made clear in the above referenced application.

Figure 47:
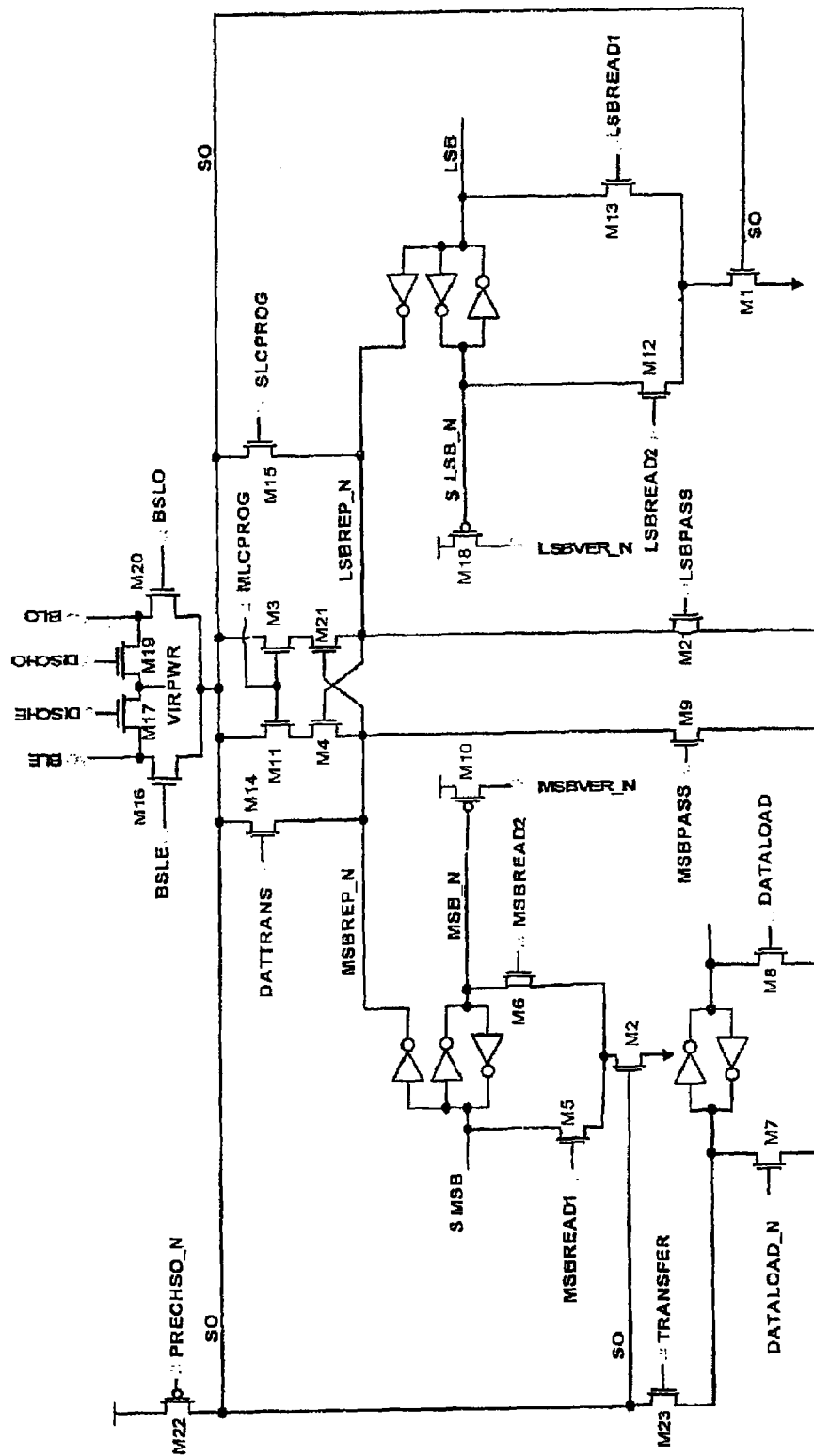
FIG. 47 depicts a page buffer for implementing the method steps according to the first and second embodiments of the invention.

A novel page buffer suitable for implementing the first and second embodiments is depicted in FIG. 47, in which the same elements in common with FIG. 46 are identified by the same labels. This novel page buffer includes the additional latch THIRD LATCH and a switch M23 controlled by the signal TRANSFER for transferring the bit stored in the THIRD LATCH to the LSB LATCH and vice versa.

Another difference between the novel page buffer of the invention and the page buffer disclosed in the cited prior European patent application is that the latch MSB LATCH is not directly connected to the switches M7 and M8 controlled by the signal DATALOAD_N and DATALOAD. This is due to the fact that, when the DATALOAD signal is asserted, a bit must be loaded into the auxiliary latch THIRD LATCH and not in the latch MSB LATCH, before being transferred to the latch LSB LATCH.

What is claimed is:

1. An apparatus comprising:
a multi-level memory cell;
a plurality of latches coupled with the multi-level memory cell, the plurality of latches including a most significant bit (MSB) latch, a least significant bit (LSB) latch, and an auxiliary latch; and
a controller coupled to the multi-level memory cell and the plurality of latches and configured to transfer one or more values between the auxiliary latch and the MSB latch and between the auxiliary latch and the LSB latch while programming the multi-level memory cell;
wherein the controller is configured to load an LSB of a logic value to be associated with the multi-level memory cell to the LSB latch from the MSB latch while programming the multi-level memory cell.

2. The apparatus of claim 1, wherein the controller is further configured to
apply a series of one or more programming pulses of a program voltage to the multi-level memory cell to set a threshold voltage of the multi-level memory cell at a level; and
apply a test read voltage to the multi-level memory cell to verify that the multi-level memory cell is set at the level, the test read voltage being less than the program voltage and greater than a read voltage to be used to read a state of the multi-level memory cell.

3. The apparatus of claim 2, wherein the controller is further configured to:
program the LSB by applying a series of one or more programming pulses;
program an MSB of the logic value by applying another series of one or more programming pulses of another program voltage to the multi-level memory cell to set the threshold voltage at another level; and
apply another test read voltage to the multi-level memory cell to verify that the multi-level cell is set at the another level, the another test read voltage being smaller than the another program voltage.

4. An apparatus comprising:
a multi-level memory cell;
a plurality of latches coupled with the multi-level memory cell, the plurality of latches including a most significant bit (MSB) latch, a least significant bit (LSB) latch, and an auxiliary latch; and
a controller coupled to the multi-level memory cell and the plurality of latches and configured to transfer one or more values between the auxiliary latch and the MSB latch and between the auxiliary latch and the LSB latch while programming the multi-level memory cell;
wherein the controller is further configured to
apply a series of one or more programming pulses of a program voltage to the multi-level memory cell to set a threshold voltage of the multi-level memory cell at a level; and
apply a test read voltage to the multi-level memory cell to verify that the multi-level memory cell is set at the level, the test read voltage being less than the program voltage and greater than a read voltage to be used to read a state of the multi-level memory cell,
wherein the controller is further configured to:
program an LSB of a logic value to be associated with the multi-level memory cell by applying a series of one or more programming pulses;
program an MSB of the logic value by applying another series of one or more programming pulses of another program voltage to the multi-level memory cell to set the threshold voltage at another level; and
apply another test read voltage to the multi-level memory cell to verify that the multi-level cell is set at the another level, the another test read voltage being smaller than the another program voltage; and
wherein the controller is configured to program the LSB by being configured to:
load the LSB into the LSB latch from the MSB latch;

apply the series of one or more programming pulses based at least in part on the LSB loaded into the LSB latch; and
set the LSB latch to a value to end the series of one or more programming pulses.

5. An apparatus comprising:
a multi-level memory cell;
a plurality of latches coupled with the multi-level memory cell, the plurality of latches including a most significant bit (MSB) latch, a least significant bit (LSB) latch, and an auxiliary latch; and
a controller coupled to the multi-level memory cell and the plurality of latches and configured to transfer one or more values between the auxiliary latch and the MSB latch and/or between the auxiliary latch and the LSB latch while programming the multi-level memory cell;
wherein the controller is further configured to:
apply a series of one or more programming pulses of a program voltage to the multi-level memory cell to set a threshold voltage of the multi-level memory cell at a level; and
apply a test read voltage to the multi-level memory cell to verify that the multi-level memory cell is set at the level, the test read voltage being less than the program voltage and greater than a read voltage to be used to read a state of the multi-level memory cell;
wherein the controller is further configured to:
program an LSB of a logic value to be associated with the multi-level memory cell by applying a series of one or more programming pulses;
program an MSB of the logic value by applying another series of one or more programming pulses of another program voltage to the multi-level memory cell to set the threshold voltage at another level; and
apply another test read voltage to the multi-level memory cell to verify that the multi-level cell is set at the another level, the another test read voltage being smaller than the another program voltage;
wherein the controller is configured to program the LSB by being configured to:
load the LSB into the LSB latch from the MSB latch;
apply the series of one or more programming pulses based at least in part on the LSB loaded into the LSB latch; and
set the LSB latch to a value to end the series of one or more programming pulses; and
wherein the controller is configured to program the LSB by being configured to:
re-load the LSB into the LSB latch from the MSB latch after said setting of the LSB latch to the value;
apply the test read voltage to verify that the multi-level memory cell is set at the level after said re-loading of the LSB into LSB latch; and
set the LSB latch to the value based at least in part on a verification that the multi-level memory cell is set at the level.

6. An apparatus comprising:
a multi-level memory cell;
a plurality of latches coupled with the multi-level memory cell, the plurality of latches including a most significant bit (MSB) latch, a least significant bit (LSB) latch, and an auxiliary latch; and
a controller coupled to the multi-level memory cell and the plurality of latches and configured to transfer one or more values between the auxiliary latch and the MSB latch and between the auxiliary latch and the LSB latch while programming the multi-level memory cell;
wherein the controller is further configured to
apply a series of one or more programming pulses of a program voltage to the multi-level memory cell to set a threshold voltage of the multi-level memory cell at a level; and
apply a test read voltage to the multi-level memory cell to verify that the multi-level memory cell is set at the level, the test read voltage being less than the program voltage and greater than a read voltage to be used to read a state of the multi-level memory cell
wherein the controller is further configured to:
program an LSB of a logic value to be associated with the multi-level memory cell by applying a series of one or more programming pulses;
program an MSB of the logic value by applying another series of one or more programming pulses of another program voltage to the multi-level memory cell to set the threshold voltage at another level; and
apply another test read voltage to the multi-level memory cell to verify that the multi-level cell is set at the another level, the another test read voltage being smaller than the another program voltage; and
wherein the controller is configured to program the MSB by being configured to:
load the MSB into the MSB latch of a page buffer;
retrieve the LSB from the multi-level cell with the read voltage;
load the LSB into the LSB latch and the auxiliary latch; and
apply the another series of one or more programming pulses based at least in part on the MSB and the LSB loaded into the first MSB latch and the LSB latch, respectively.

7. The apparatus of claim 6, wherein the controller is configured to program the MSB by being configured to:
set the MSB latch and the LSB latch to a value to end the another series of one or more programming pulses.

8. The apparatus of claim 7, wherein the controller is configured to program the MSB by being configured to:
retrieve the MSB from the multi-level cell with another read voltage;
re-load the MSB into the MSB latch;
re-load the LSB into the LSB latch from the auxiliary latch;
apply the another test read voltage to verify that the multi-level cell is set at the another level after said re-loading of the MSB and the LSB; and
set the first latch and the second latch to the value based at least in part on a verification that the multi-level memory cell is set at the another level.

9. A method of programming a multi-level memory cell, comprising:
transferring one or more values between an auxiliary latch of the multi-level memory cell and a most significant bit (MSB) latch of the multi-level memory cell and between the auxiliary latch and a least significant bit (LSB) latch of the multi-level memory cell while programming the multi-level memory cell; and
loading an LSB of a logic value to be associated with the multi-level memory cell into the LSB latch from the MSB latch.

10. The method of claim 9, and further comprising:
applying a series of one or more programming pulses of a program voltage to a multi-level memory cell to set a threshold voltage of the multi-level memory cell at a level; and
applying a test read voltage to the multi-level memory cell to verify that the multi-level memory cell is set at the level, the test read voltage being less than the program voltage and greater than a read voltage to be used to read a state of the multi-level memory cell.

11. The method of claim 10, and further comprising:
   programming the LSB by applying a series of one or more programming pulses;
   programming an MSB of the logic value by applying another series of one or more programming pulses of another program voltage to the multi-level memory cell to set the threshold voltage at another level; and
   applying another test read voltage to the multi-level memory cell to verify that the multi-level cell is set at the another level, the another read voltage being smaller than the another program voltage.

12. A method of programming a multi-level memory cell, comprising:
   transferring one or more values between an auxiliary latch of the multi-level memory cell and a most significant bit (MSB) latch of the multi-level memory cell and between the auxiliary latch and a least significant bit (LSB) latch of the multi-level memory cell while programming the multi-level memory cell;
   applying a series of one or more programming pulses of a program voltage to a multi-level memory cell to set a threshold voltage of the multi-level memory cell at a level;
   applying a test read voltage to the multi-level memory cell to verify that the multi-level memory cell is set at the level, the test read voltage being less than the program voltage and greater than a read voltage to be used to read a state of the multi-level memory cell;
   programming an LSB of a logic value to be associated with the multi-level memory cell by applying a series of one or more programming pulses;
   programming an MSB of the logic value by applying another series of one or more programming pulses of another program voltage to the multi-level memory cell to set the threshold voltage at another level; and
   applying another test read voltage to the multi-level memory cell to verify that the multi-level cell is set at the another level, the another read voltage being smaller than the another program voltage;
   wherein programming the LSB comprises:
      loading the LSB into the LSB latch from the MSB latch;
      applying the series of one or more programming pulses based at least in part on the LSB loaded into the LSB latch; and
      setting the LSB latch to a value to end the series of one or more programming pulses.

13. A method of programming a multi-level memory cell, comprising:
   transferring one or more values between an auxiliary latch of the multi-level memory cell and a most significant bit (MSB) latch of the multi-level memory cell and/or between the auxiliary latch and a least significant bit (LSB) latch of the multi-level memory cell while programming the multi-level memory cell;
   applying a series of one or more programming pulses of a program voltage to a multi-level memory cell to set a threshold voltage of the multi-level memory cell at a level;
   applying a test read voltage to the multi-level memory cell to verify that the multi-level memory cell is set at the level, the test read voltage being less than the program voltage and greater than a read voltage to be used to read a state of the multi-level memory cell;
   programming an LSB of a logic value to be associated with the multi-level memory cell by applying a series of one or more programming pulses;
   programming an MSB of the logic value by applying another series of one or more programming pulses of another program voltage to the multi-level memory cell to set the threshold voltage at another level; and
   applying another test read voltage to the multi-level memory cell to verify that the multi-level cell is set at the another level, the another read voltage being smaller than the another program voltage;
   wherein programming the LSB comprises:
      loading the LSB into the LSB latch from the MSB latch;
      applying the series of one or more programming pulses based at least in part on the LSB loaded into the LSB latch; and
      setting the LSB latch to a value to end the series of one or more programming pulses; and
   wherein programming the LSB further comprises:
      re-loading the LSB into the first latch from the second latch after said setting of the first latch to the value;
      applying the test read voltage to verify that the multi-level memory cell is set at the level after said re-loading of the LSB into the first latch; and
      setting the first latch to the value based at least in part on a verification that the multi-level memory cell is set at the level.

14. A method of programming a multi-level memory cell, comprising:
   transferring one or more values between an auxiliary latch of the multi-level memory cell and a most significant bit (MSB) latch of the multi-level memory cell and between the auxiliary latch and a least significant bit (LSB) latch of the multi-level memory cell while programming the multi-level memory cell;
   applying a series of one or more programming pulses of a program voltage to a multi-level memory cell to set a threshold voltage of the multi-level memory cell at a level;
   applying a test read voltage to the multi-level memory cell to verify that the multi-level memory cell is set at the level, the test read voltage being less than the program voltage and greater than a read voltage to be used to read a state of the multi-level memory cell;
   programming an LSB of a logic value to be associated with the multi-level memory cell by applying a series of one or more programming pulses;
   programming an MSB of the logic value by applying another series of one or more programming pulses of another program voltage to the multi-level memory cell to set the threshold voltage at another level; and
   applying another test read voltage to the multi-level memory cell to verify that the multi-level cell is set at the another level, the another read voltage being smaller than the another program voltage;
   wherein programming the MSB comprises:
      loading the MSB into the MSB latch of a page buffer;
      retrieving the LSB from the multi-level cell with the read voltage;
      loading the LSB into the LSB latch and the auxiliary latch; and
      applying the another series of one or more programming pulses based at least in part on the MSB and the LSB loaded into the first MSB latch and the LSB latch, respectively.

15. The method of claim 14, wherein programming the MSB further comprises setting the MSB latch and the LSB latch to a value to end the another series of one or more programming pulses.

16. The method of claim 15, wherein programming the MSB further comprises:
retrieving the MSB from the multi-level cell with another read voltage;
re-loading the MSB into the MSB latch;
re-loading the LSB into the LSB latch from the auxiliary latch;
applying the another test read voltage to verify that the multi-level cell is set at the another level after said re-loading of the MSB and the LSB; and
setting the first latch and the second latch to the value based at least in part on a verification that the multi-level memory cell is set at the another level.

17. A method of programming a multi-level memory cell, comprising:
storing a least significant bit (LSB) of the multi-level memory cell into a most significant bit (MSB) latch;
applying a set of programming pulses to the multi-level memory cell to program the LSB;
verifying whether the LSB of the multi-level memory cell has been programmed after each programming pulse;
inhibiting application of further programming pulses when the LSB of the multi-level memory cell has been correctly programmed;
transferring the LSB from the MSB latch to a LSB latch;
loading a logic 1 in the LSB latch when the LSB of the multi-level memory cell has been correctly programmed;
loading a MSB into the MSB latch;
reading the LSB from multi-level memory cell and transferring the LSB to an auxiliary latch;
applying a second set of programming pulses to the multi-level memory cell to program the MSB; and
verifying whether the MSB of the multi-level memory cell has been programmed after each programming pulse of the second set of programming pulses;
loading a logic 1 in the MSB latch when the MSB of the multi level memory cell has been correctly programmed;
copying the LSB from the auxiliary latch to the LSB latch; and
reading the MSB from the multi-level memory cell and transferring the MSB to the MSB latch.

18. The method of claim 17, wherein the programmed multi-level memory cell LSB is read using a read voltage less than or equal to a program voltage of the first set of programming pulses.

19. The method of claim 17, wherein the programmed multi-level memory cell MSB is read using a second read voltage less than or equal to a program voltage of the second set of programming pulses.

20. The method of claim 19, wherein the program voltage of the second set of programming pulses is chosen from one of two program voltages depending on the bits to be stored in the multi-level memory cell.

* * * * *